(12) United States Patent
Fulford et al.

(10) Patent No.: US 11,769,831 B2
(45) Date of Patent: Sep. 26, 2023

(54) HIGH PERFORMANCE FLOATING BODY VFET WITH DIELECTRIC CORE

(71) Applicant: Tokyo Electron Limited, Tokyo (JP)

(72) Inventors: H. Jim Fulford, Marianna, FL (US);
Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 144 days.

(21) Appl. No.: 17/315,958

(22) Filed: May 10, 2021

(65) Prior Publication Data
US 2022/0102552 A1 Mar. 31, 2022

Related U.S. Application Data

(60) Provisional application No. 63/085,641, filed on Sep. 30, 2020.

(51) Int. Cl.
| | |
|---|---|
| *H01L 29/78* | (2006.01) |
| *H01L 27/092* | (2006.01) |
| *H01L 29/66* | (2006.01) |
| *H01L 21/8238* | (2006.01) |
| *H01L 23/522* | (2006.01) |

(52) U.S. Cl.
CPC .. *H01L 29/7841* (2013.01); *H01L 21/823871* (2013.01); *H01L 21/823878* (2013.01); *H01L 23/5226* (2013.01); *H01L 27/092* (2013.01); *H01L 29/66666* (2013.01); *H01L 29/7827* (2013.01)

(58) Field of Classification Search
None
See application file for complete search history.

(56) References Cited

U.S. PATENT DOCUMENTS

2019/0058035 A1* 2/2019 Cho ............... H01L 21/76224

* cited by examiner

*Primary Examiner* — Hsien Ming Lee
(74) *Attorney, Agent, or Firm* — Oblon, McClelland, Maier & Neustadt, L.L.P.

(57) ABSTRACT

Aspects of the present disclosure provide a floating body vertical field effect transistor with dielectric core and a method for fabricating the same. The floating body vertical field effect transistor can include a first semiconductor device including sidewall structures of a first gate metal sandwiched by dielectric layers, a first epitaxially grown channel surrounded by the sidewall structures and can include a second semiconductor device formed on the same substrate adjacent to the first semiconductor device; a salicide layer or doped layer formed between the first and second semiconductor devices and metallization contacting each of the S/D regions and the gate regions. The floating body vertical field effect transistor may include a P+ epitaxially grown channel formed on the same substrate adjacent to an N+ epitaxially grown channel, the P+ epitaxially grown channel separated from N+ epitaxially grown channel by a diffusion break.

20 Claims, 18 Drawing Sheets

(a)

(b)

(a)

(b)

HIGH PERFORMANCE FLOATING BODY VFET WITH DIELECTRIC CORE

CROSS REFERENCE TO RELATED APPLICATIONS

This present disclosure claims the benefit of U.S. Provisional Application No. 63/085,641, filed on Sep. 30, 2020, which is incorporated herein by reference in its entirety.

FIELD OF THE INVENTION

This disclosure relates to microelectronic devices semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Accordingly, it is one object of the present disclosure to provide vertical field effect devices and methods for forming vertical field effect transistors.

SUMMARY

Techniques herein provide vertical field effect transistors (VFET) with floating body (FB) design and a dielectric insulated core. Because a dielectric insulated core is in the center of the device channel, high performance devices can be achieved with localized isolation beneath the vertical channel regions. In an aspect of the present disclosure, a 3D stack of metal and dielectrics enables such designs and methods for forming such designs. As a result of the techniques described in the present disclosure, higher density circuits may be produced at reduced cost. Also provided is improved control of short channel transistor effects, higher performance $Id_{sat}$ (drain current with the device biased in the saturation region) with less $Id_{off}$ (off state leakage), and wells as the ability to precisely define gate electrode regions self-aligned to vertical channel.

In an exemplary embodiment, a device is described, comprising a first stack of epitaxially grown semiconductor material extending perpendicular to a working surface of a substrate, the first stack of epitaxially grown semiconductor material wrapping around a first dielectric material structure extending perpendicular to the working surface of a substrate, the first stack of epitaxially grown semiconductor material including a layer of intrinsic semiconductor material in between layers of doped semiconductor material, a bottom layer of the first stack of epitaxially grown semiconductor material forming a first source/drain, the layer of intrinsic semiconductor material being a channel of a first field effect transistor, and the upper layer of the first stack of epitaxially grown semiconductor material forming a second source/drain; and a second stack extending perpendicular to the working surface and positioned in a plane with the first stack of epitaxially grown semiconductor material, the second stack wrapping around the first stack of epitaxially grown semiconductor material, the second stack having a first metal layer positioned in between layers of dielectric material, the first metal layer forming a gate of the first field effect transistor.

In another exemplary embodiment, a semiconductor device is described, comprising: a P-type substrate including a PMOS field effect transistor adjacent an NMOS field effect transistor, the P-type substrate including: a dielectric diffusion break configured to electrically isolate the PMOS field effect transistor from the NMOS field effect transistor; a background doped N-type region; the PMOS field effect transistor including: a first stack of epitaxially grown semiconductor material located over the N-type implant region and extending perpendicular to a working surface of a substrate, the first stack wrapping around a first dielectric material structure, the first stack of epitaxially grown semiconductor material including a first layer of intrinsic semiconductor material in between layers of P+ doped semiconductor material, a bottom layer of the first stack forming a first source/drain, the first layer of intrinsic semiconductor material being a channel of the PMOS field effect transistor, and the upper layer of the first stack forming a second source/drain; a second stack extending perpendicular to the working surface positioned in plane with the first stack and wrapping around the first stack, the second stack having a first metal layer formed of Metal 2 material, the first metal layer positioned in between layers of dielectric material, the first metal layer forming a gate of PMOS field effect transistor; wherein the first layer of intrinsic semiconductor material is at a same plane as the first metal layer; the NMOS field effect transistor including: a third stack of epitaxially grown semiconductor material extending perpendicular to a working surface of the P-type substrate, the third stack wrapping around a second dielectric material structure, the third stack of epitaxially grown semiconductor material including a second layer of intrinsic semiconductor material in between layers of N+ doped semiconductor material, a bottom layer of the third stack forming a third source/drain, the layer of intrinsic semiconductor material being a channel of the NMOS field effect transistor, and the upper layer of the third stack forming a fourth source/drain; a fourth stack extending perpendicular to the working surface of the P-type substrate, positioned in plane with the third stack and wrapping around the third stack, the fourth stack having a second metal layer of Metal 1 material positioned in between layers of dielectric material, the second metal layer forming a gate of the second field effect transistor; wherein the second layer of intrinsic semiconductor material is at a same plane as the second metal layer; a first high-K layer formed between the first stack and the second stack; and a second high-K layer formed between the third stack and the fourth stack.

In another exemplary embodiment, a method of microfabrication of a semiconductor device is described, the method comprising epitaxially growing a first stack of semiconductor material extending perpendicular to a working surface of a substrate, the first stack wrapping around a first dielectric material structure, the first stack including a layer of intrinsic semiconductor material in between layers of doped semiconductor material, a bottom layer of the first stack forming a first source/drain, the layer of intrinsic semiconductor material being a channel of a first field effect transistor, and an upper layer of the first stack forming a second source/drain; depositing a second stack extending perpendicular to the working surface positioned in plane with the first stack and wrapping around the first stack, the second stack having a first metal layer positioned in between layers of dielectric material and at a same plane as the layer of intrinsic semiconductor material, the first metal layer forming a gate of the first field effect transistor; forming a high-K layer between the first stack and the second stack; and implanting a doped region located along the working surface of the substrate beneath the first stack and the second stack.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
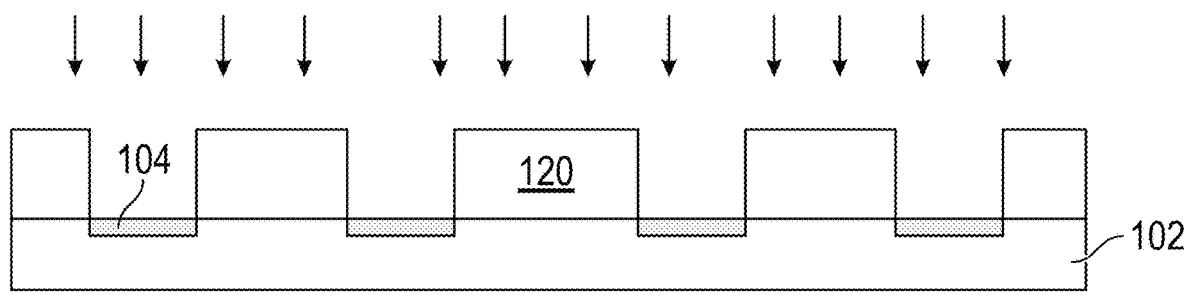
FIG. 1A illustrates a Flow A process starting with implantation of an N-type dopant into a substrate, according to aspects of the present disclosure.

Referring now to the drawings, wherein like reference numerals designate identical or corresponding parts throughout the several views.

As defined in the present disclosure, the term "spike anneal" is defined as an annealing process performed at high temperature and short duration with a high ramp-rate.

The term "salicide" refers to a technology used in the microelectronics industry to form electrical contacts between the semiconductor device and the supporting interconnect structure. The salicide process involves the reaction of a metal thin film with silicon in the active regions of the device, ultimately forming a metal silicide contact through a series of annealing and/or etch processes. The term "salicide" is a compaction of the phrase "self-aligned silicide". The description "self-aligned" suggests that the contact formation does not require photolithography patterning processes.

Aspects of the present disclosure describe methods for making vertical field effect transistors (VFET) with floating body (FB) design and a dielectric insulated core. Because a dielectric insulated core is in the center of the device channel, high performance devices can be achieved with localized isolation beneath the vertical channel regions. VFET devices with dielectric insulated cores and methods for making VFET devices with dielectric insulated core include a 3D stack of metal and dielectrics. The processes described herein enable higher density circuits to be produced at reduced cost. Also provided is improved control of short channel transistor effects, higher performance Idsat with less Idoff, as well as the ability to precisely define gate electrode regions self-aligned to the vertical channel. The FB (floating body) thickness value can be tuned as required to cover different CMOS circuit elements and configurations.

Figure 1B:
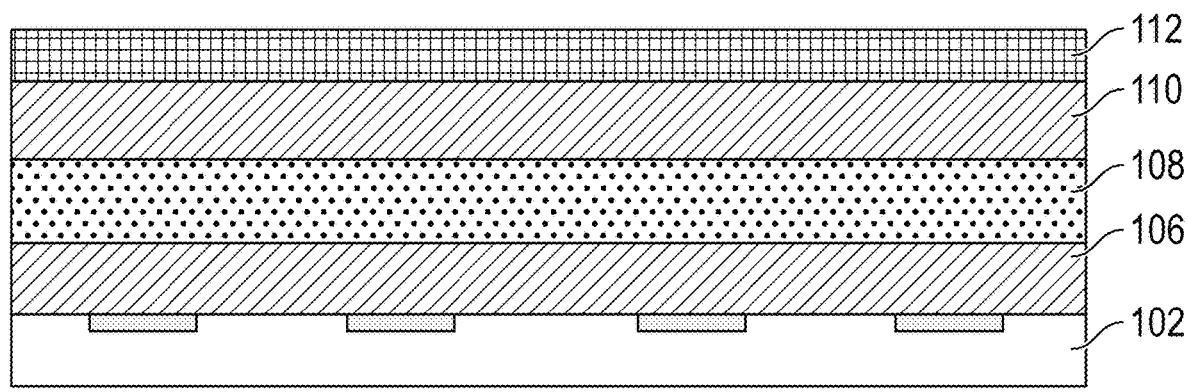
FIG. 1B illustrates a layer stack deposited on the substrate of FIG. 1A, according to aspects of the present disclosure.
Figure 1C:
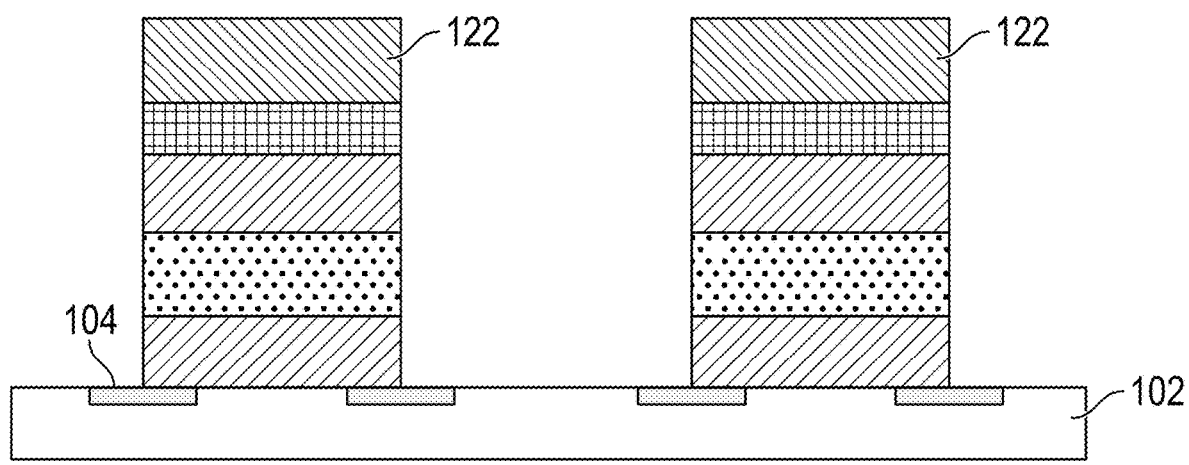
FIG. 1C illustrates the patterning of openings in the layer stack of FIG. 1B, according to aspects of the present disclosure.
Figure 1D:
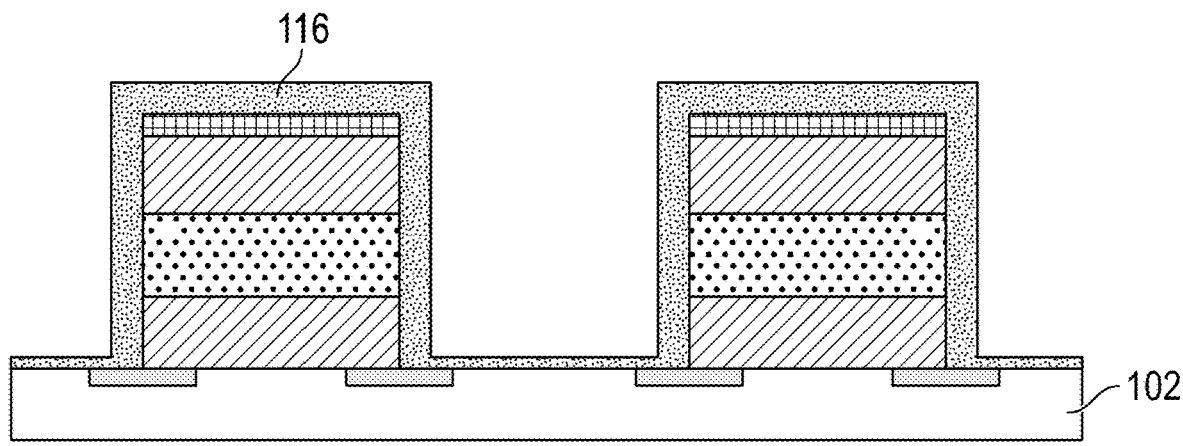
FIG. 1D shows formation of a high-K layer on the substrate, according to aspects of the present disclosure.
Figure 1E:
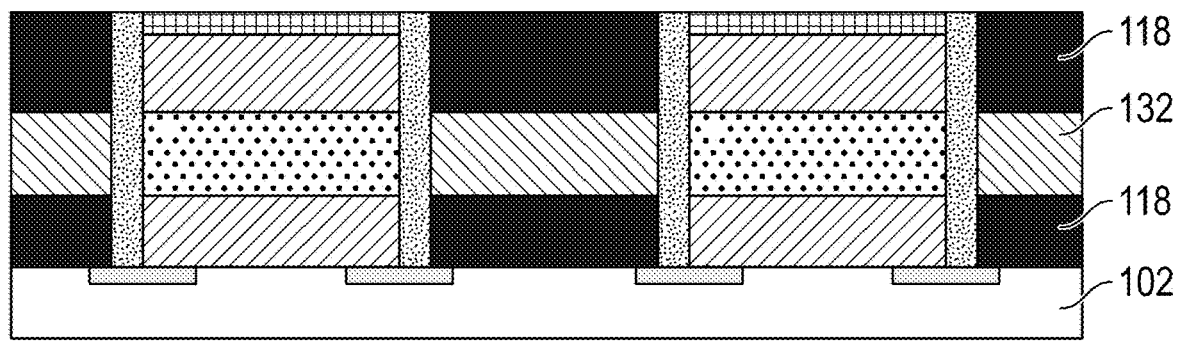
FIG. 1E shows an N+ epi stack formed in the openings of the layer stack, according to aspects of the present disclosure.
Figure 1F:
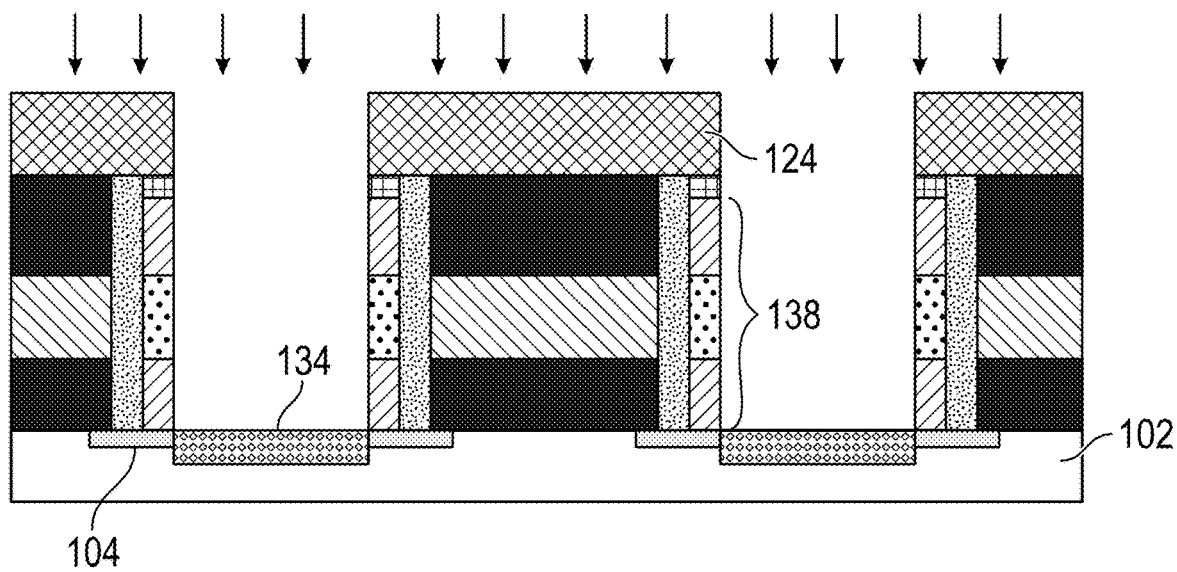
FIG. 1F illustrates patterning and etching of the layer stack with N+ doping of the substrate floor, according to aspects of the present disclosure.
Figure 1G:
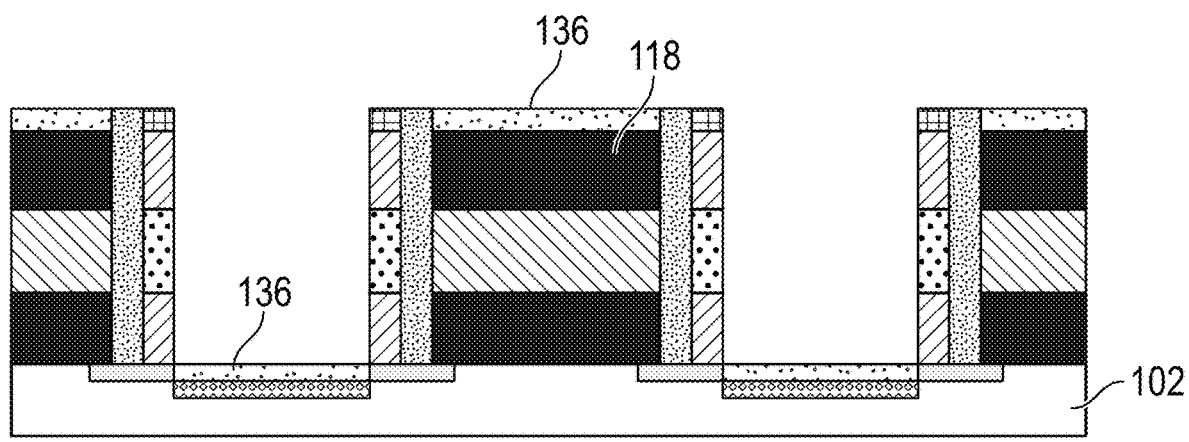
FIG. 1G shows salicidation of regions of the substrate, according to aspects of the present disclosure.
Figure 1H:
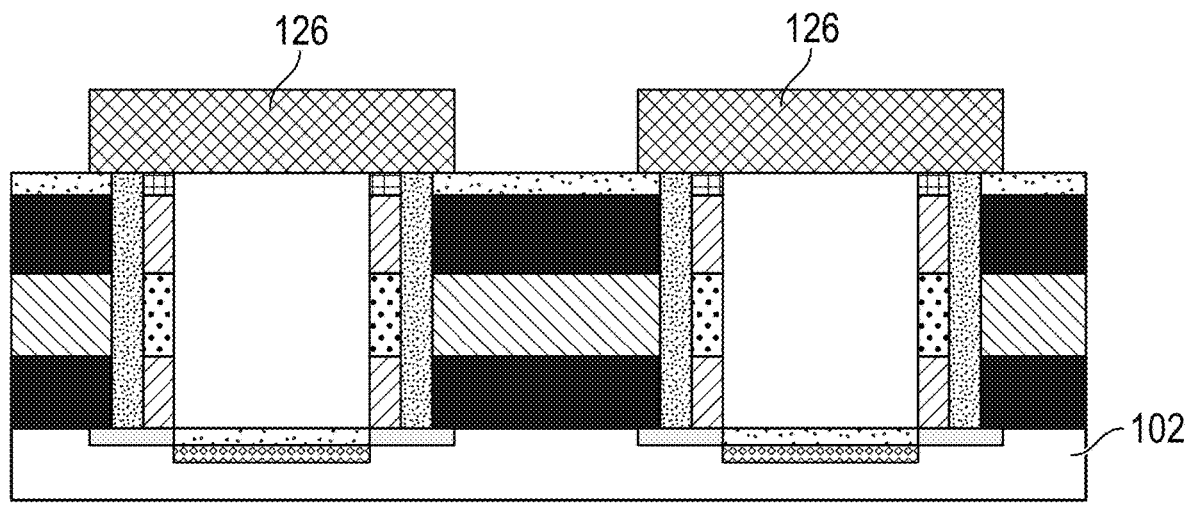
FIG. 1H shows patterning and etching to form openings in the epi stacks, according to aspects of the present disclosure.
Figure 1I:
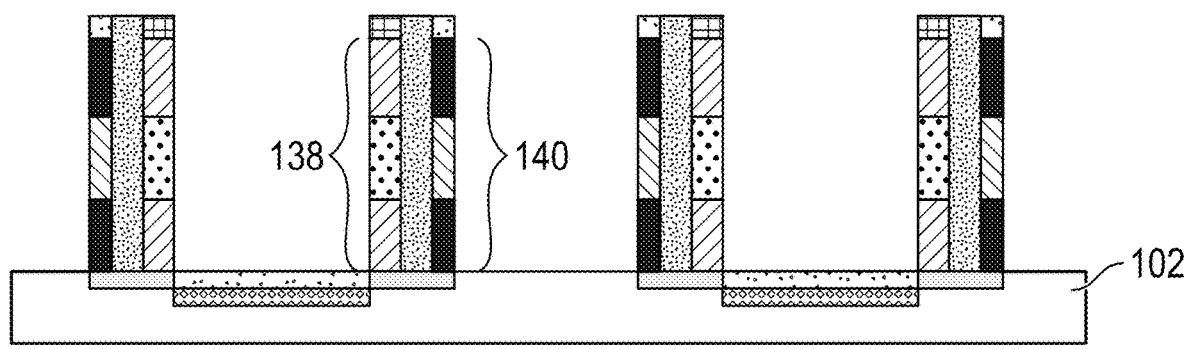
FIG. 1I shows N+ epi stacks with sidewall structures, according to aspects of the present disclosure.
Figure 1J:
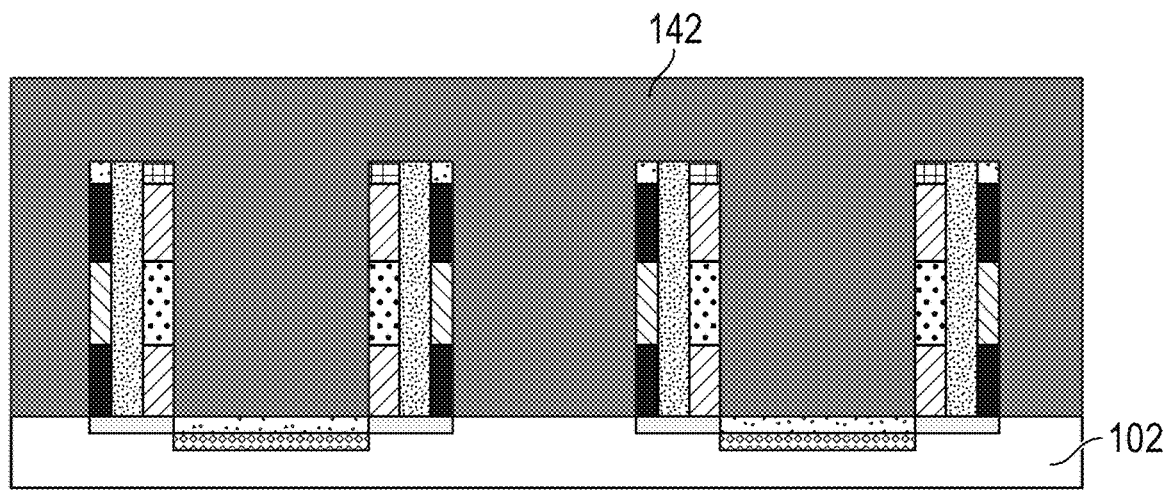
FIG. 1J shows a dielectric film formed on the substrate, according to aspects of the present disclosure.
Figure 1K:
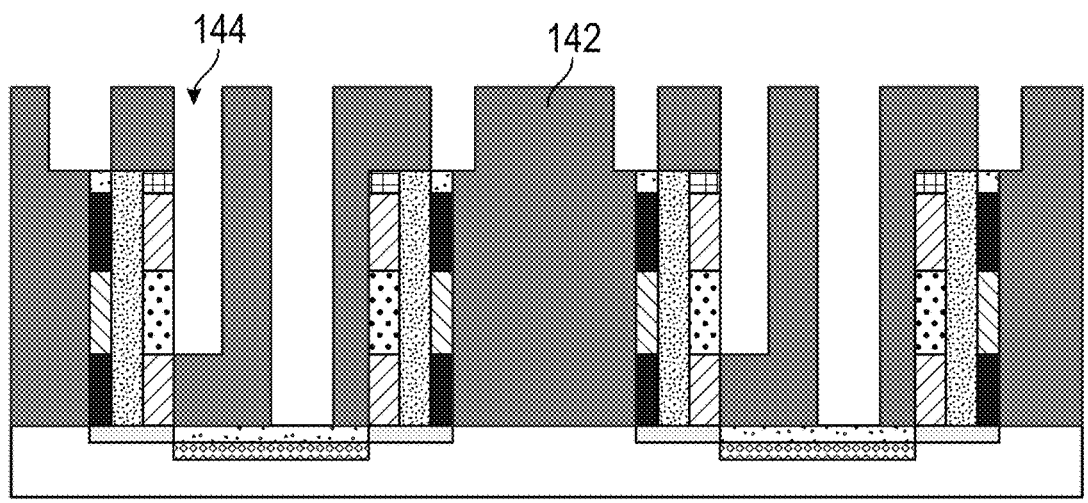
FIG. 1K shows patterning and etching of the dielectric film to form openings for via metal, according to aspects of the present disclosure.
Figure 1L:
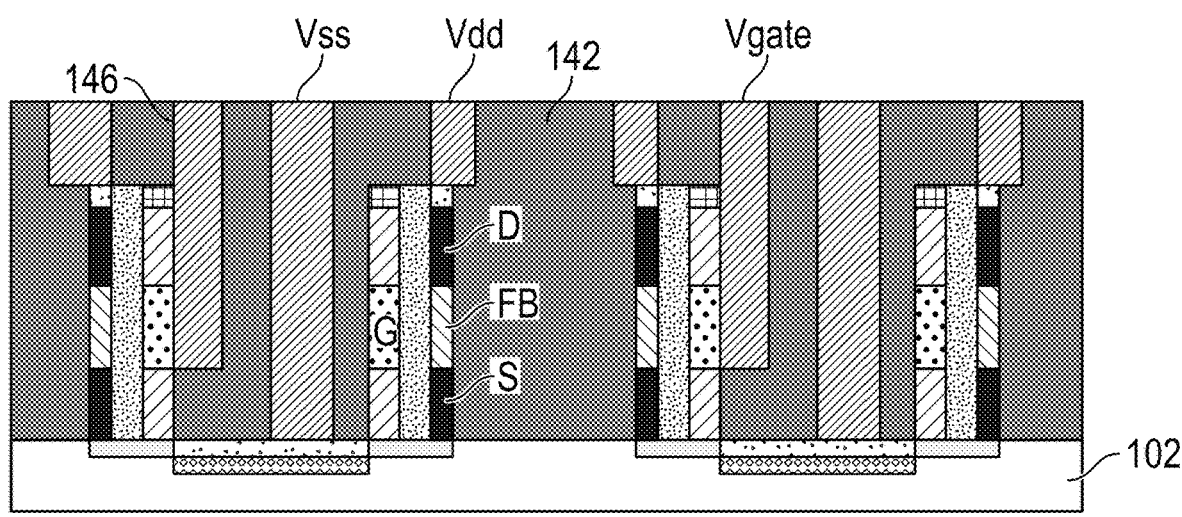
FIG. 1L shows metallization of the substrate, according to aspects of the present disclosure.
Figure 1M:
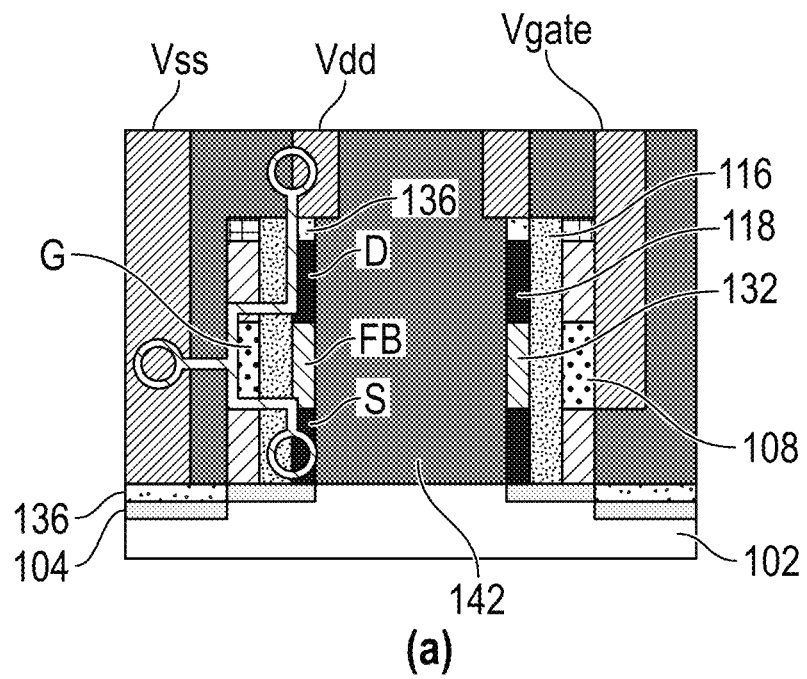
FIG. 1M shows (a) a side view of a single NMOS device and (b) shows a top view of the single NMOS device, according to aspects of the present disclosure.
Figure 1M:
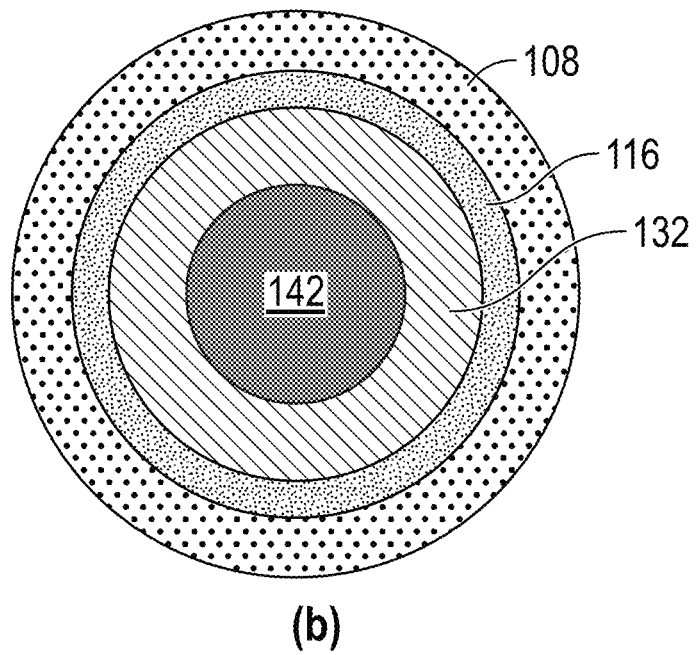
Figure 1N:
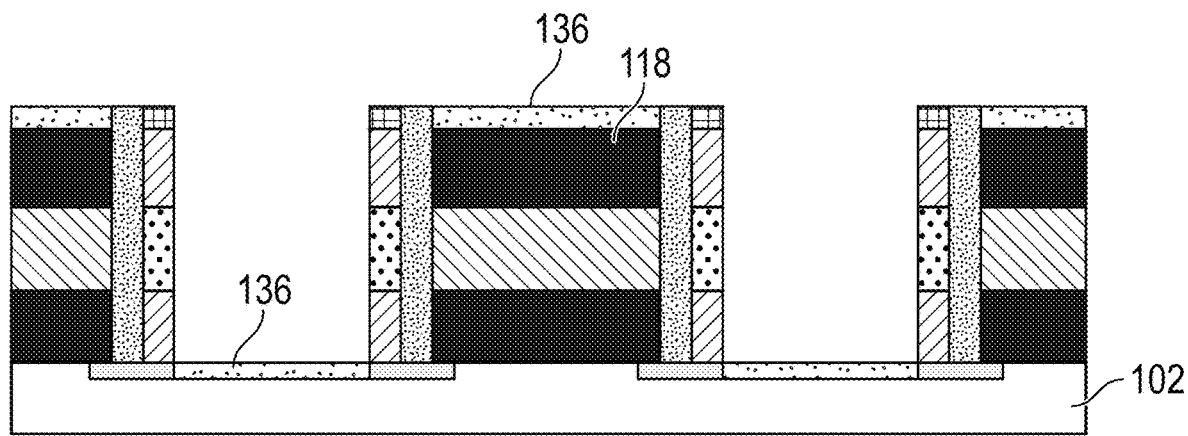
FIG. 1N shows an alternative to FIG. 1F in which salicide is formed in the floor of the substrate instead of N+ doping, according to aspects of the present disclosure.
Figure 1O:
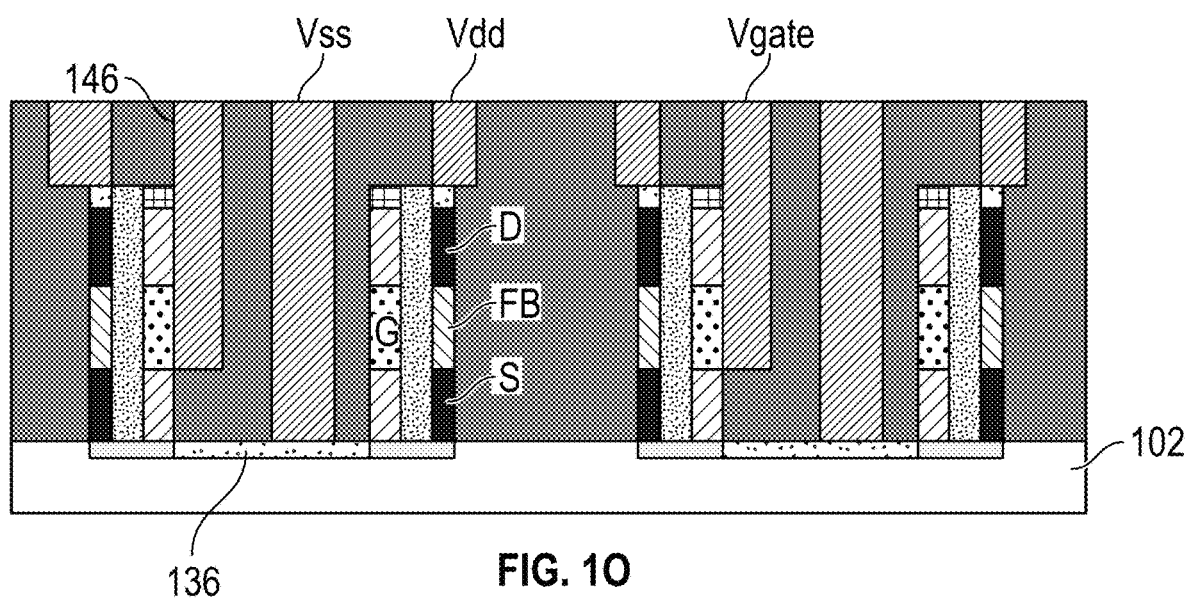
FIG. 1O shows the finished NMOS device of the alternative flow of FIG. 1N, according to aspects of the present disclosure.

FIGS. 1A-1O, Flow A, illustrate formation of a high-performance FB VFET with dielectric core NMOS.

FIGS. 2A-2L, Flow B, illustrate formation of a high-performance FB VFET with dielectric core PMOS.

Figure 3A:
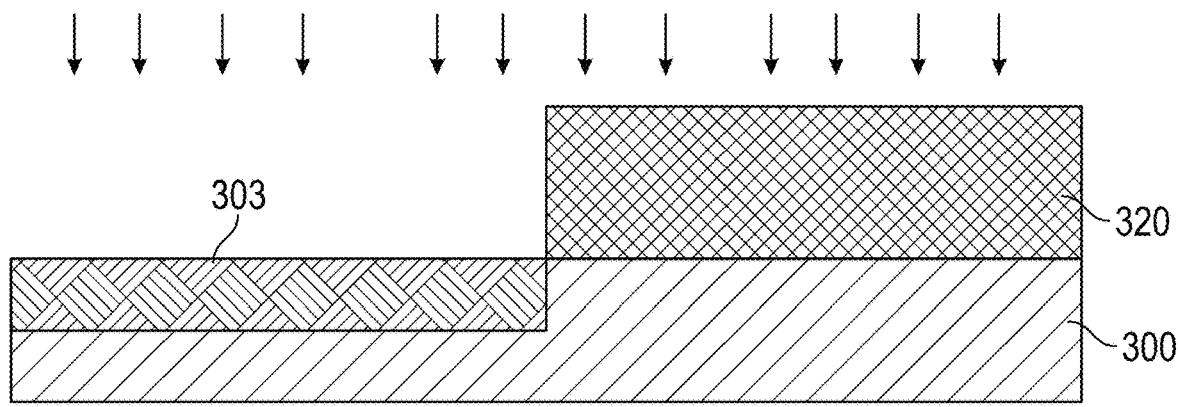
FIG. 3A illustrates a Flow C process starting with implantation of an N-type dopant into a P-type substrate, according to aspects of the present disclosure.
Figure 3B:
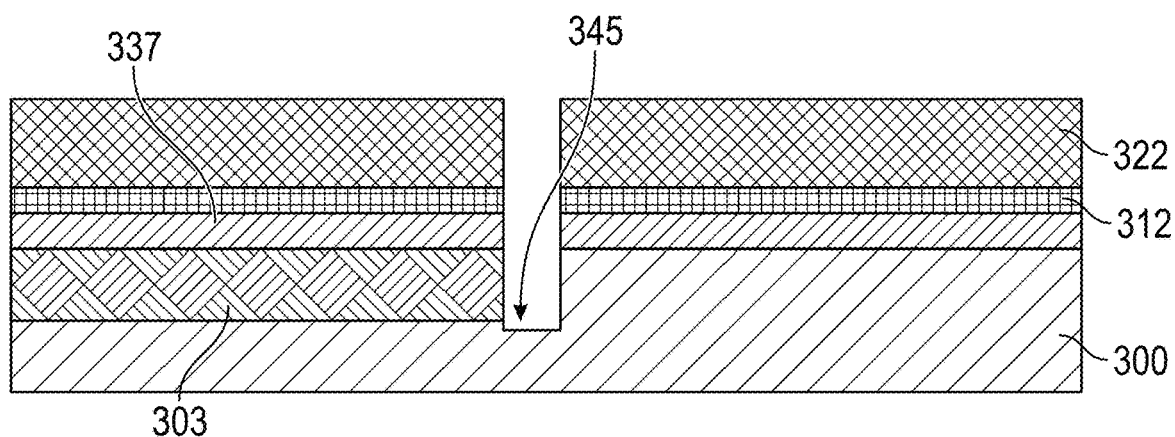
FIG. 3B shows patterning and etching of an opening for a dielectric diffusion break, according to aspects of the present disclosure.
Figure 3C:
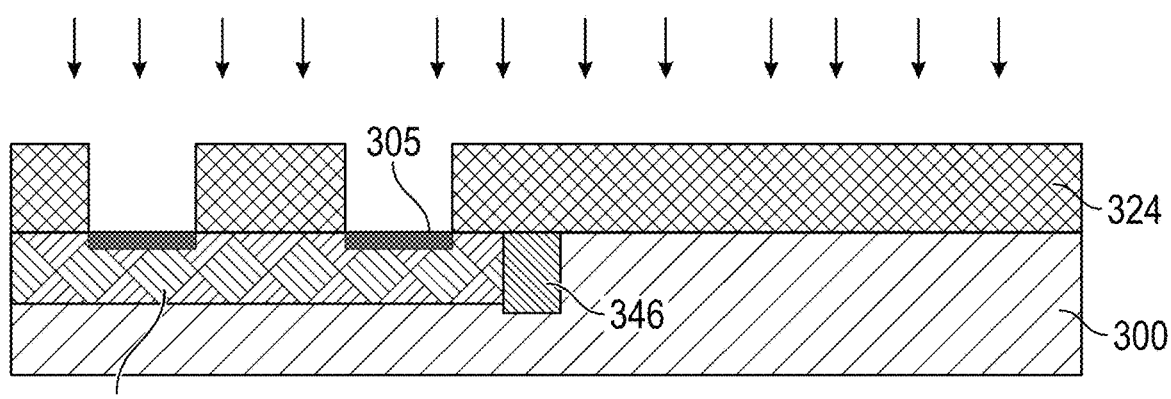
FIG. 3C shows the dielectric diffusion break and P+ implant doping in regions of the N-type dopant, according to aspects of the present disclosure.
Figure 3D:
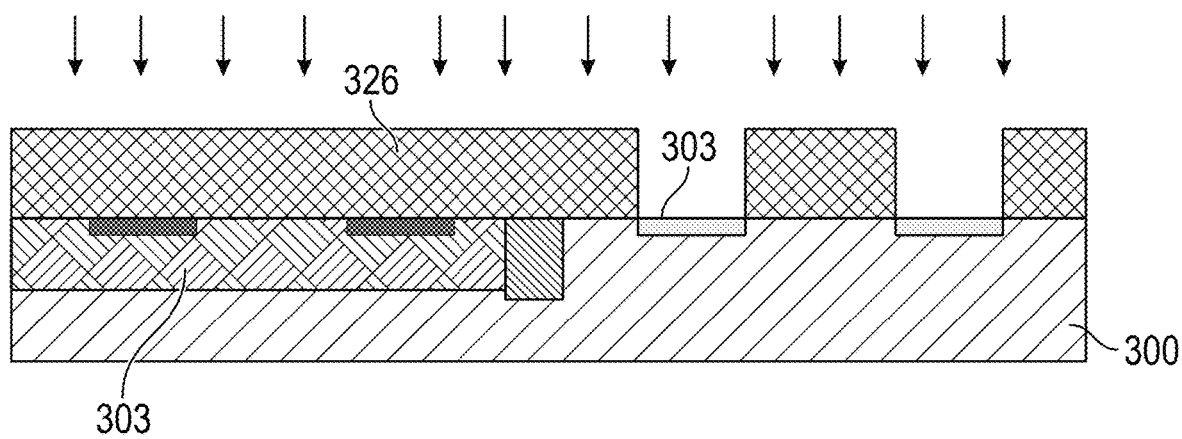
FIG. 3D shows stepwise patterning to form N+ implants in regions of the P-type substrate, according to aspects of the present disclosure.
Figure 3E:
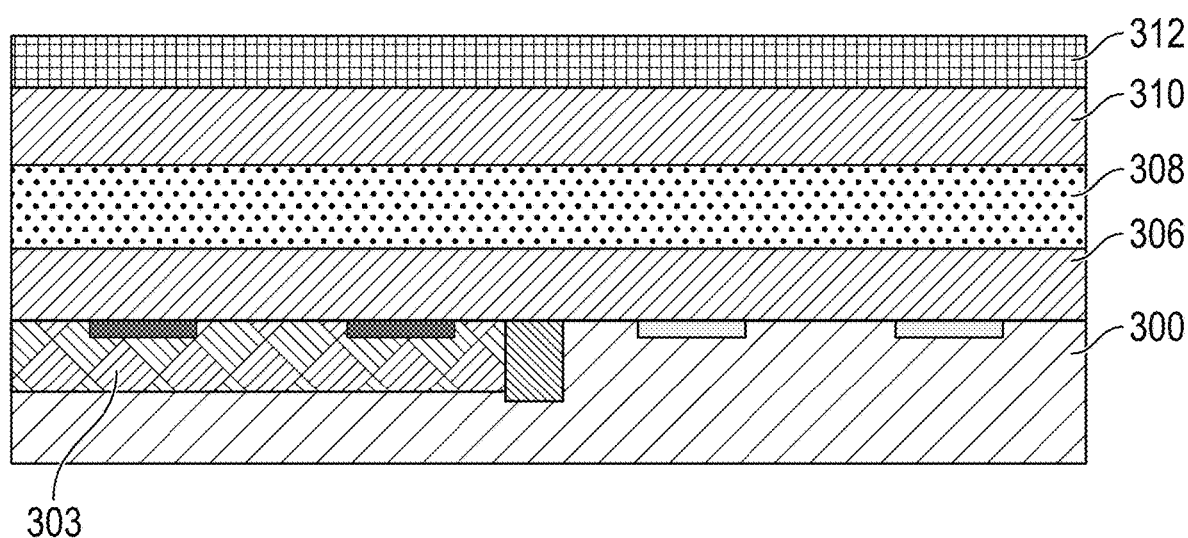
FIG. 3E shows formation of a layer stack of dielectric-Metal 2-dielectric over the substrate, according to aspects of the present disclosure.
Figure 3F:
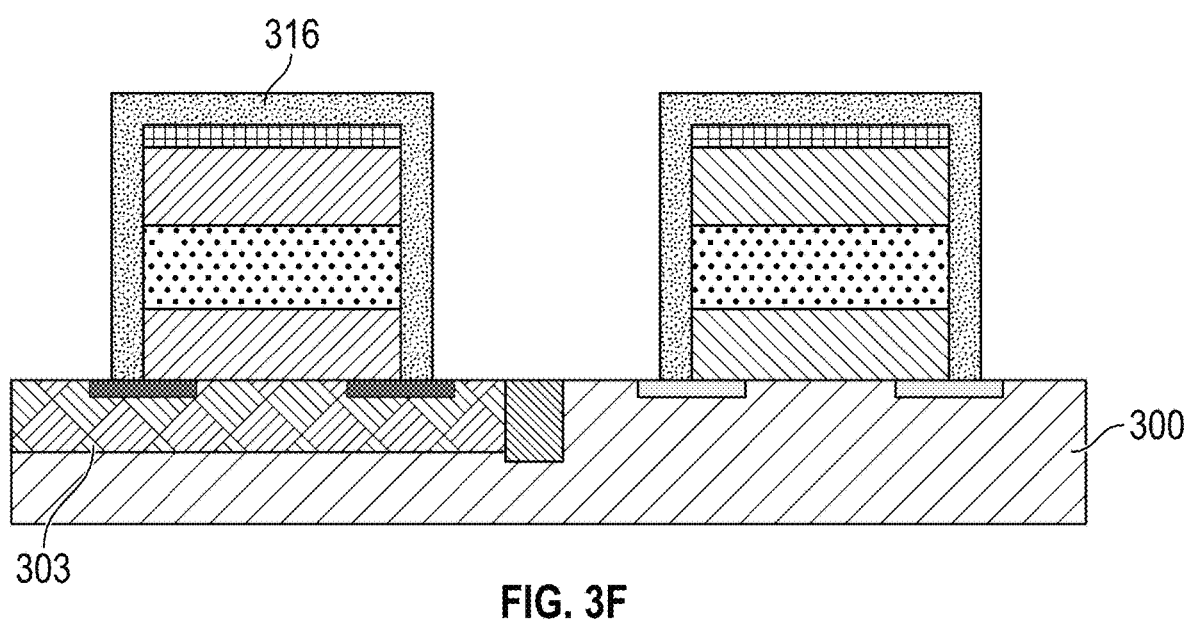
FIG. 3F shows etching of the layer stack with a high-K deposit, according to aspects of the present disclosure.
Figure 3G:
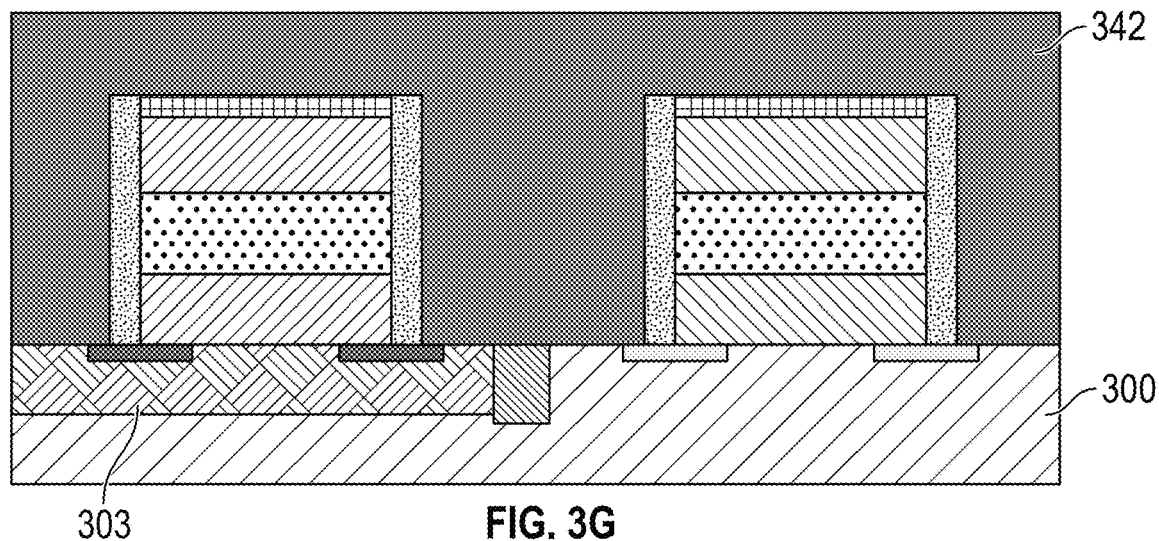
FIG. 3G shows deposition of a dielectric film over the structures of FIG. 3F, according to aspects of the present disclosure.
Figure 3H:
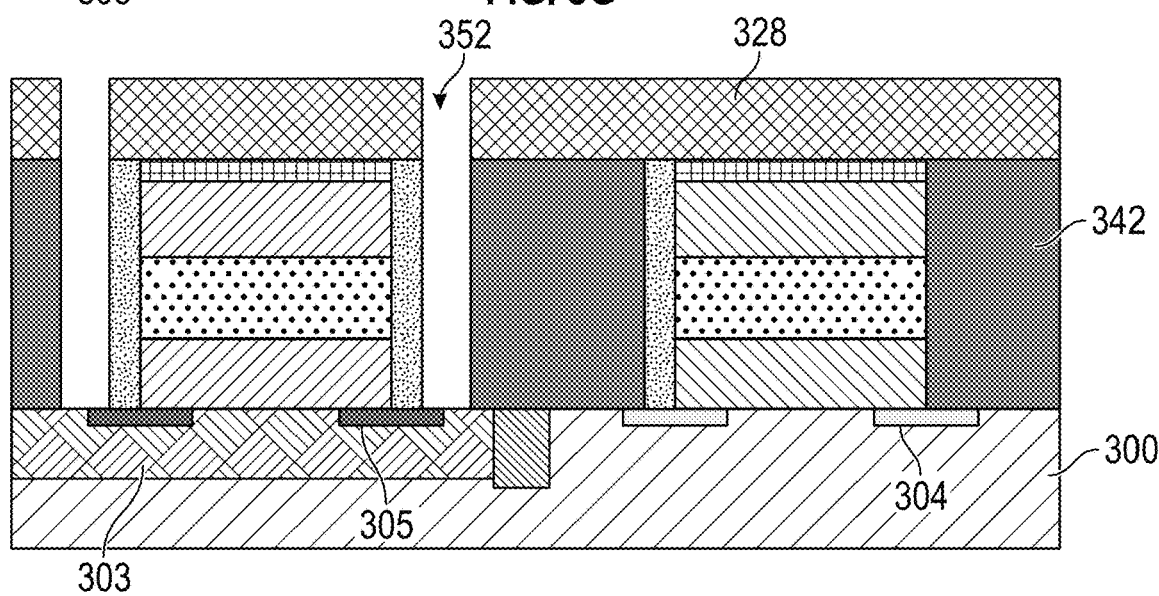
FIG. 3H shows patterning and etching of the dielectric film over the N-type substrate to form openings for future epitaxial growth of epi stacks, according to aspects of the present disclosure.
Figure 3I:
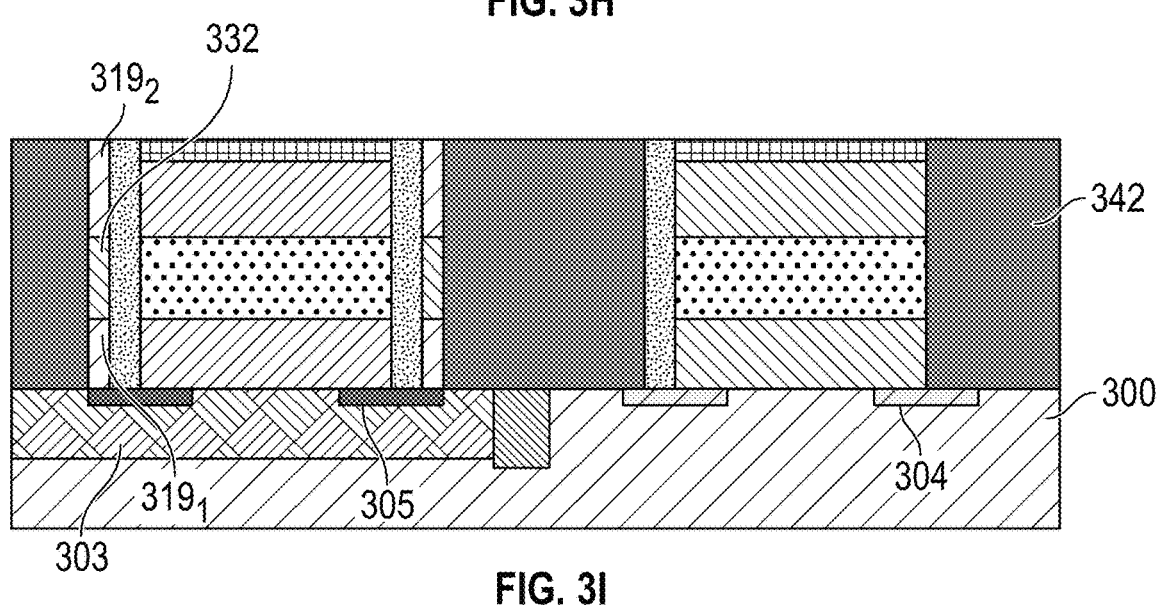
FIG. 3I shows formation of a P+ epi stack with an undoped center in the openings, according to aspects of the present disclosure.
Figure 3J:
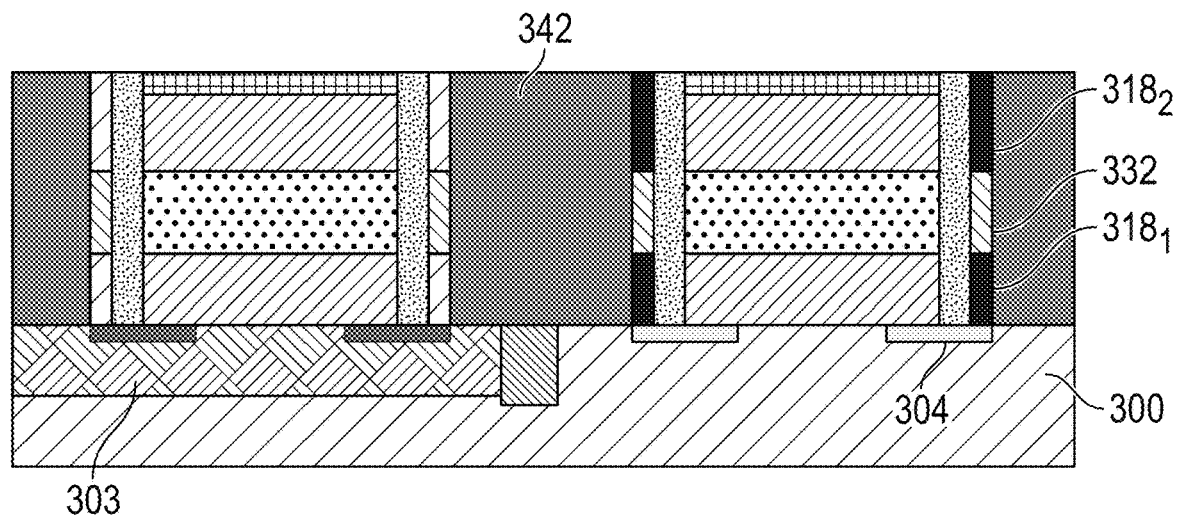
FIG. 3J shows stepwise patterning forming an N+ epi stack over the P-type substrate, according to aspects of the present disclosure.
Figure 3K:
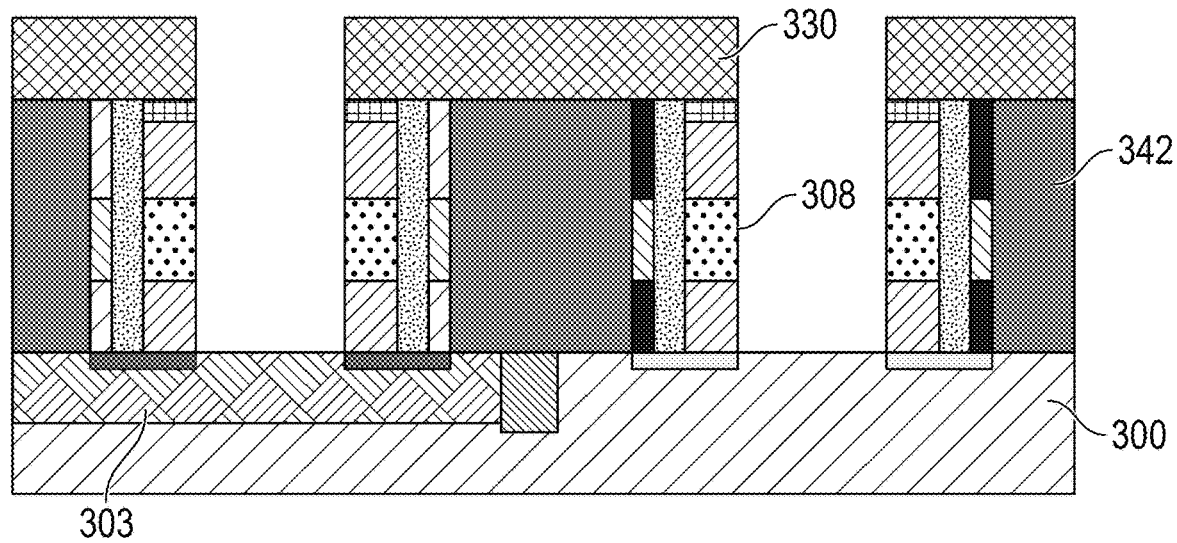
FIG. 3K shows replacement of Metal 2 with Metal 1 as the gate electrode for the NMOS device, according to aspects of the present disclosure.
Figure 3L:
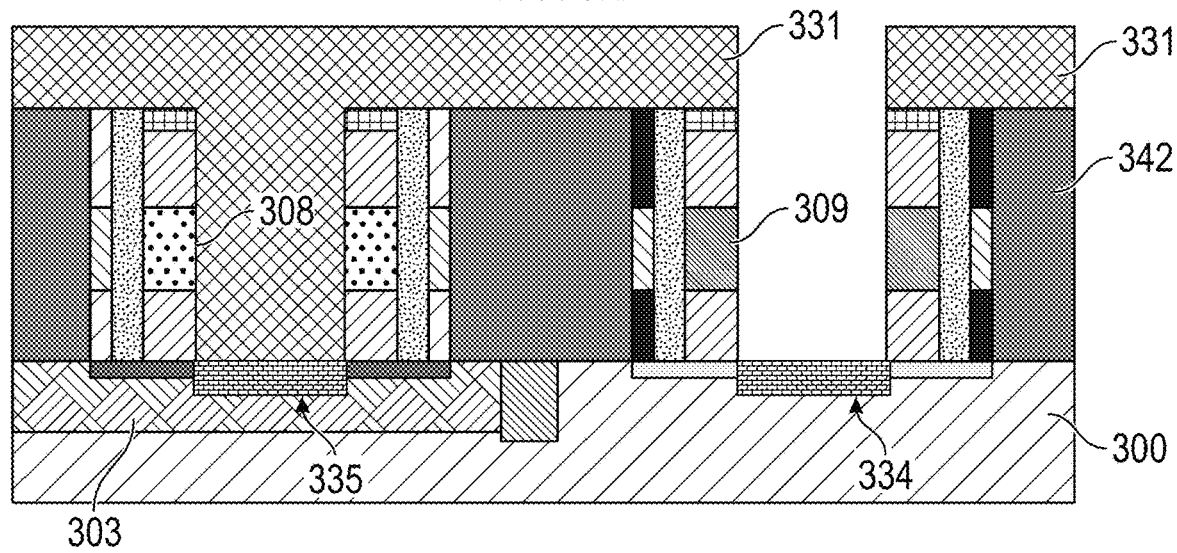
FIG. 3L shows patterning to form P+ implants between the sidewalls of the P+ epi stacks and stepwise patterning to form N+ implants between the sidewalls of the N+ epi stacks, according to aspects of the present disclosure.
Figure 3M:
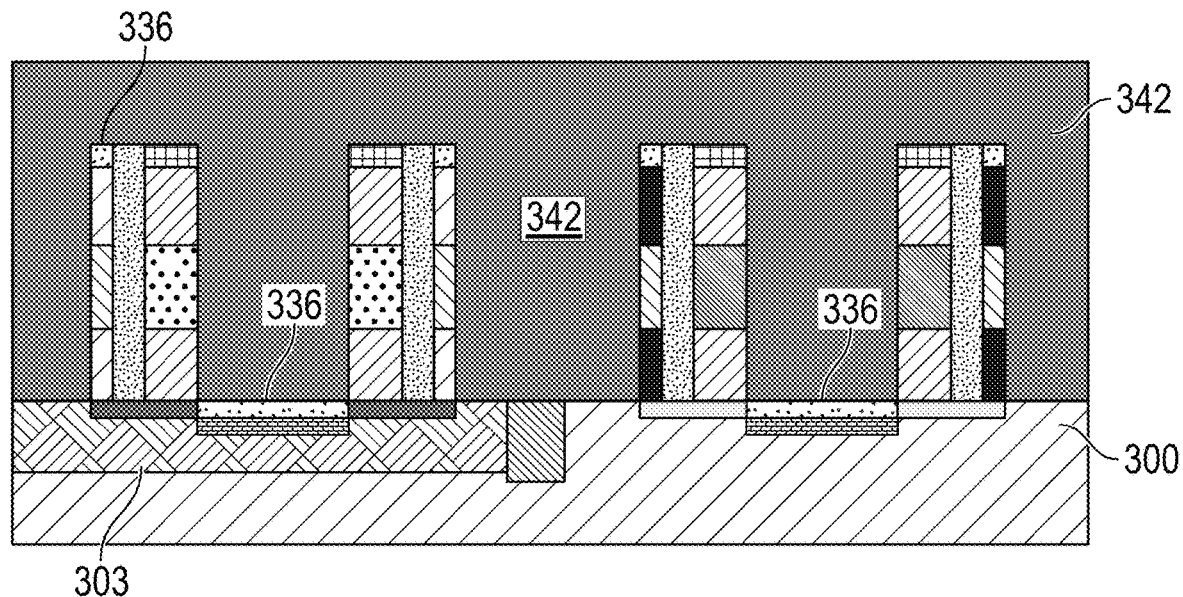
FIG. 3M shows salicidation of the P+ and N+ implants of FIG. 3L and over the epi stacks with deposition of a dielectric film over the substrate, according to aspects of the present disclosure.
Figure 3N:
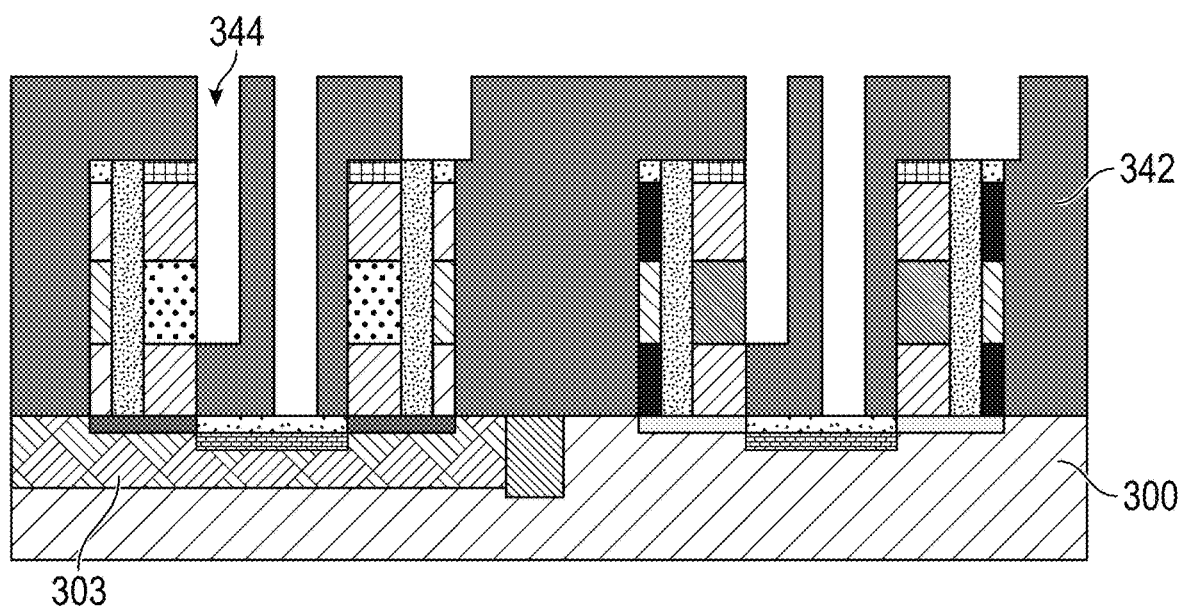
FIG. 3N shows patterning of the dielectric film for future via metal, according to aspects of the present disclosure.
Figure 3O:
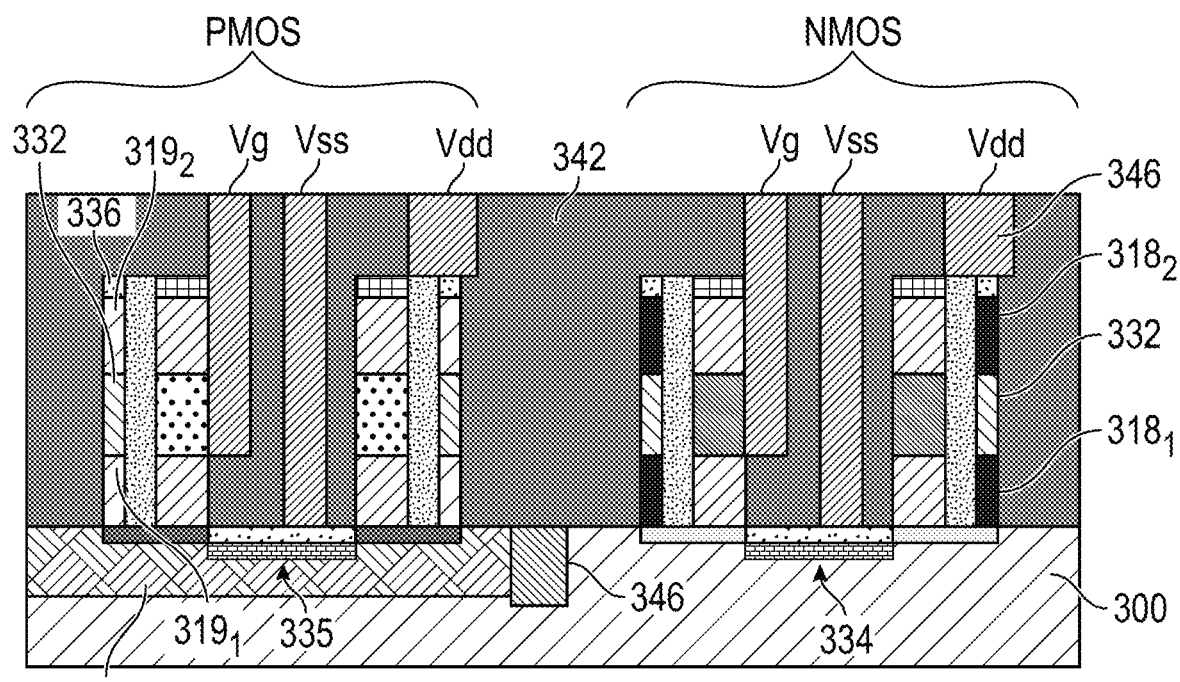
FIG. 3O shows metallization of the PMOS and NMOS devices on a single substrate isolated by a dielectric diffusion break, according to aspects of the present disclosure.
Figure 3P:
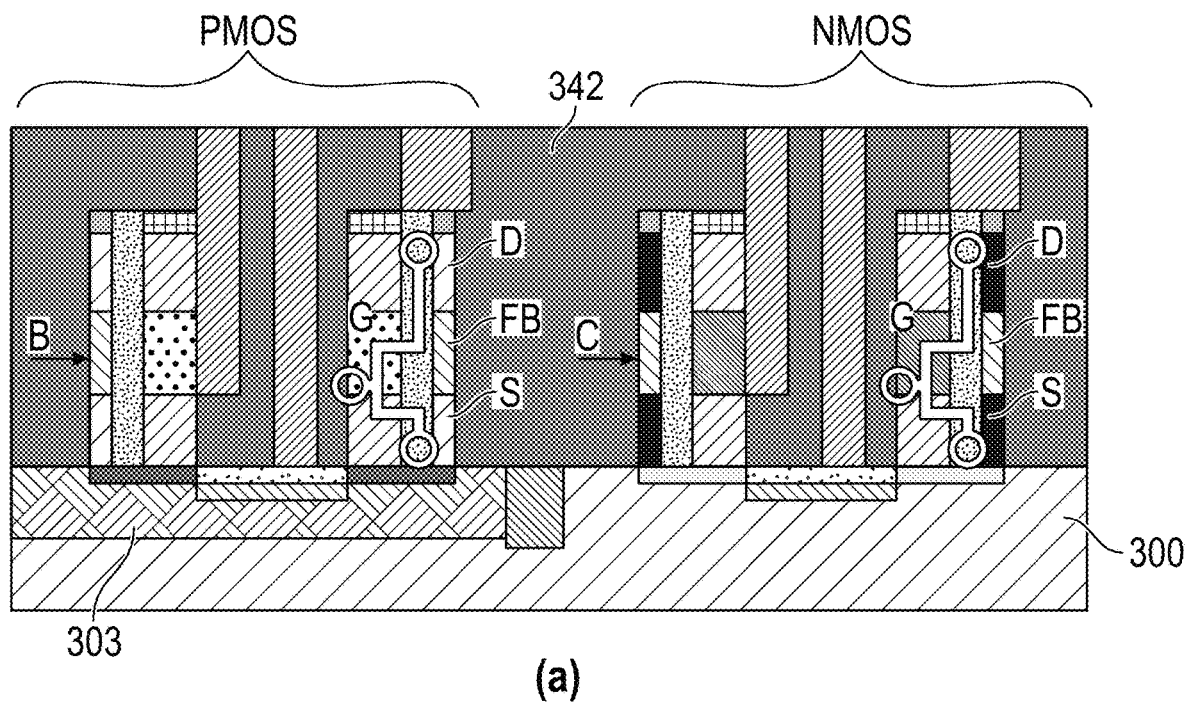
FIG. 3P shows (a) a side view of the PMOS and NMOS devices with gate, drain, source and floating bodies marked, (b) a top view of the PMOS device taken along plane B, and (c) a top view of the NMOS device taken along plane C, according to aspects of the present disclosure.
Figure 3P:
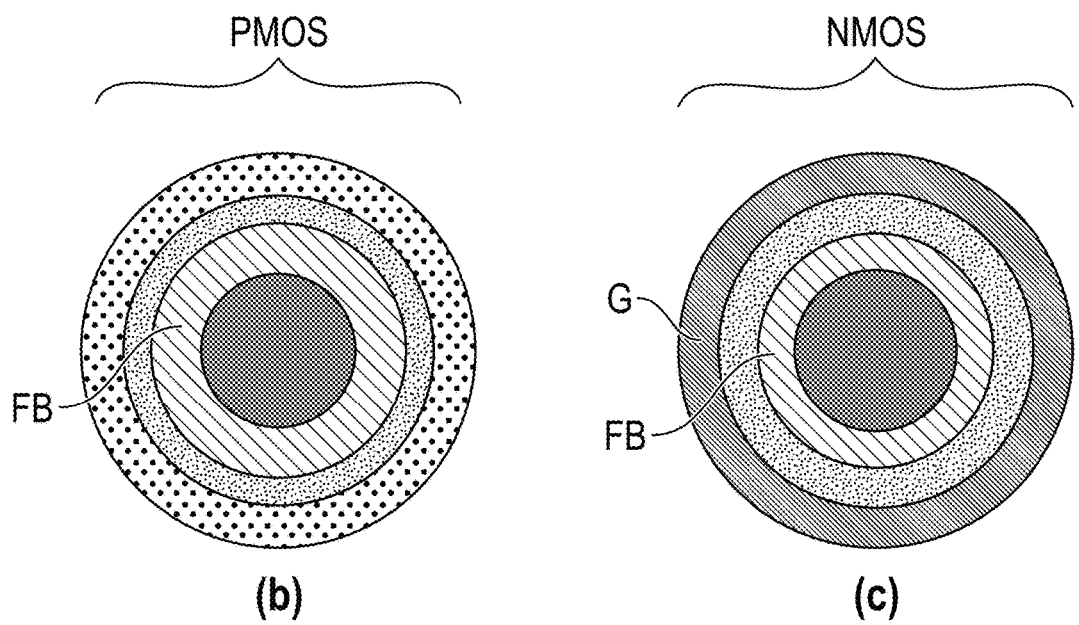

FIGS. 3A-3P, Flow C, illustrate formation of a high-performance FB VFET with dielectric core CMOS.

FIGS. 1A-1O, Flow A, the formation of a high-performance FB VFET with dielectric core NMOS is described.

In FIG. 1A, a substrate 102 is masked (photoresist mask 120) for an implantation step at select regions. This implantation builds S/D connections. N-type dopant 104 (e.g., phosphorous, arsenic, or other N-type dopants) is implanted at the select regions.

In FIG. 1B, doping mask 120 is removed, then a layer stack is deposited on the substrate. This layer stack includes a dielectric layer 106 deposited on the substrate 102, a Metal 1 layer 108 deposited on the dielectric layer 106, then a dielectric layer 110 is deposited on Metal 1 layer. Portions of the Metal 1 layer will become future gate electrodes of the NMOS devices. A capping layer 112 is formed over the dielectric layer 110. Dielectric layer 106 may be the same dielectric material or a different dielectric material from layer 110. In a non-limiting example, dielectric layer 106 may be oxide and Metal 1 may be selected from the group comprising ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer 112 is titanium nitride, TiN.

In FIG. 1C, the layer stack is masked with an etch mask 122 (such as with photoresist and photolithography) to etch out openings define future transistor geometry dimensions. The layer stack is then etched between the mask regions down to the substrate and N-type dopant 104. These openings can be circular, square/rectangular or other channel cross-sectional shape. A directional/anisotropic etch is executed using this etch mask 122 to remove uncovered portions of the layer stack until reaching and uncovering the substrate 102.

In FIG. 1D, the etch mask 122 is removed followed by high-K dielectric 116 deposition, which can be conformal. High-K dielectrics suitable for use may be $Al_2O_3$, AlN, $ZrO_2$, $HfO_2$, $HfSiO_x$, $ZrSiOx$, $HfOxNy$, $ZrOxNy$, $HfxZryOz$, $Ta_2O_5$, $La_2O_3$, $Y_2O_3$, $Nb_2O_5$, $TiO_2$, $Pr_2O_3$, $Gd_2O_3$, SiBN, BCN, hydrogenated boron carbide and the like.

In FIG. 1E, a spacer etch can be executed to remove the high-K deposit from horizontal surfaces, then an N+ epi (epitaxial) stack is grown with undoped silicon 132 in between N+ epitaxial layers 118.

In FIG. 1F, the substrate is masked to execute an etch to define separate metal gate electrode regions self-aligned with dielectric stack. Thus, the epitaxial material can be masked with an etch mask 124 that extends beyond a diameter of the epi material to leave a sidewall structure on the epi material. The sidewall structure includes the dielectric-metal-dielectric stack 138. Optionally, an N+ implant step can be executed to form source/drain connections between the stacks. N+ implants or N+ doped epi examples include arsenic, phosphorous or antimony.

FIG. 1G shows removal of the etch mask 124 with optional spike anneal, followed by silicide deposition and salicidation forming salicide layers 136 on the top of the N+ epi layer 118 and over the N+ implant 134. An etch is then performed to remove unreacted silicide.

The salicide process begins with deposition of a thin transition metal layer over fully formed and patterned semiconductor devices (e.g. regions of a transistor). The wafer is heated, allowing the transition metal to react with exposed silicon in the active regions of the semiconductor device (e.g., source or drain) forming a low-resistance transition metal silicide. In a non-limiting example of tungsten silicide, WSi2, the W metal is first deposited, then a spike anneal forms WSi2 where W is in contact with the silicon regions, forming W silicide. If W is over an oxide no reaction occurs, and a rinse is performed to remove the unreacted W over insulative regions.

In FIG. 1H, an etch mask 126 is formed to etch a portion of the epi stack 140, which leaves adjoining structures of the epi stack and the dielectric-metal-dielectric stack 138 as shown in FIG. 1I. In FIG. 1I, the etch mask 126 has been removed.

In FIG. 1J, a dielectric film 142 is deposited and then planarized by etch back or chemical-mechanical polishing (CMP).

In FIG. 1K, the dielectric film 142 is masked or patterned to etch via openings 144 for metal contacts.

FIG. 1L shows these openings filled with via metal 146. In a non-limiting example, the via metal can be tungsten, W. Metal can be deposited with overburden, with the overburden removed by CMP. Source, S, drain, D, gate Ge, and floating body FB are labeled. Vss represents the contact through via metal to the source, S. Vdd represents the contact through via metal to the drain, D. Vgate represents the contact through via metal to the Metal 1 layer of the dielectric-metal-dielectric stack 138 (shown in FIG. 1I).

Vgate may be a gate metal stack having an interfacial oxide layer, a hafnium oxide layer, HfO, and a titanium carbide layer, TiC. In a non-limiting example, after TiC deposition, a titanium nitride liner is deposited, followed by a tungsten, W, layer.

FIG. 1M shows (a) a cross-sectional side view of a single NMOS device, and FIG. 1M(b) is a top view cross-section of the NMOS device taken by a plane through the metal 1 layer 108, floating body silicon layer 132 and dielectric region 142 shown in FIG. 1M(a). FIG. 1M(a) has a salicide layer 136 connected to the source region, S. Underlying the salicide layer is the N-type dopant 104. Salicide 136 also forms a contact between the drain (top N+ epi layer 118) to the Vdd via metal.

As seen in FIG. 1M, (a) and (b) illustrate an NMOS device extending perpendicular to a substrate 102, having an N+ epitaxially grown stack including a layer of intrinsic semiconductor material 132 between layers of N+ epitaxially grown material 118, the N+ epitaxially grown stack wrapping around a dielectric core of dielectric material 142, a layer of high-K material 116 wrapping around the N+ epitaxially grown stack and a gate electrode stack including a Metal 1 layer 108 between layers of dielectric material.

FIGS. 1N-1O illustrate an optional flow without the N+ implant of FIG. 1F.

FIG. 1N shows salicide layer 136 formed between the stacks, over the substrate 102 and over the N+ epi layer 118. The salicide layer connects the source regions of two NMOS transistors to the future via metal Vss contact and the drain region of the top N+ epi layer 118 to the future Vdd metal contact.

The optional flow duplicates the process steps described above and shown in FIG. 1H-1K. A photoresist mask is formed as shown in FIG. 1H to open the body of the epitaxial area as previously shown in FIG. 1I. As previously shown in FIG. 1J, a dielectric film 142 is deposited and etched to form via openings 144 as shown in FIG. 1K.

In FIG. 1O, the openings are filled with via metal 146 to form the Vss, Vdd and Vgate contacts. In this flow, the salicide layer 136 over the substrate 102 forms the source connection without an underlying N-layer implant. Accordingly, cylindrical (or rectangular), vertical channel devices are formed with a dielectric core and having a undoped silicon (or optionally, germanium, Ge) channel.

Figure 2A:
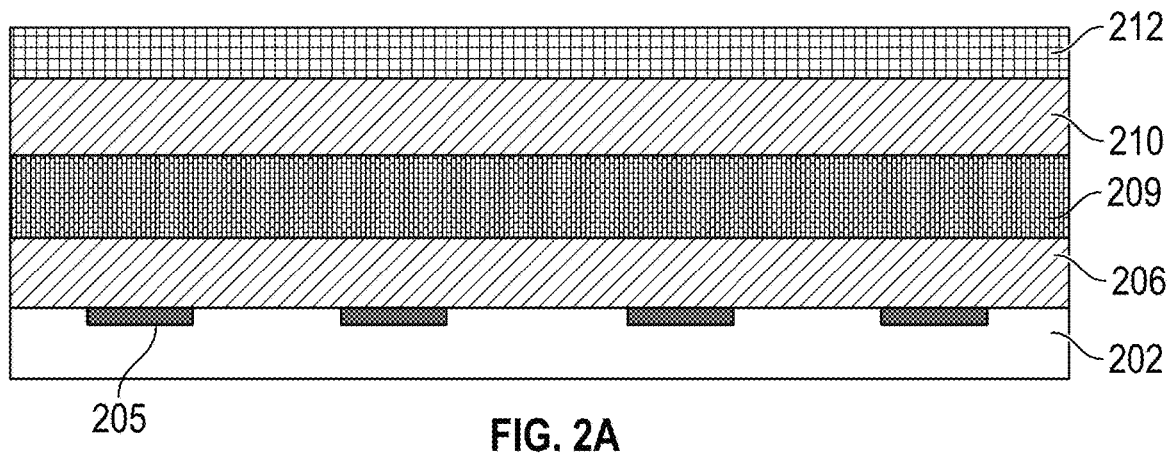
FIG. 2A shows a Flow B process starting with a layer stack over a substrate with P+ doping regions, according to aspects of the present disclosure.

FIGS. 2A-2S, Flow B, illustrate formation of a high-performance FB VFET with dielectric core PMOS. FIGS. 2A-2S are similar to FIGS. 1-12, except that there is P-type doping, and Metal 2 is used between dielectric layers instead of Metal 1.

FIG. 2A illustrates the substrate 202 having been implanted with a P-type dopant 205, in a process similar to that described with respect to FIG. 1A. A layer stack is grown upon the implanted substrate. A first dielectric layer 206 is deposited over the substrate 202, a Metal 2 layer 209 is deposited over the first layer 206, a second dielectric layer 210 is deposited over the Metal 2 layer 209, and a capping layer 212 is formed over the second dielectric layer 210. The Metal 2 layer can be selected from the group comprising ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer 212 is titanium nitride, TiN.

Figure 2B:
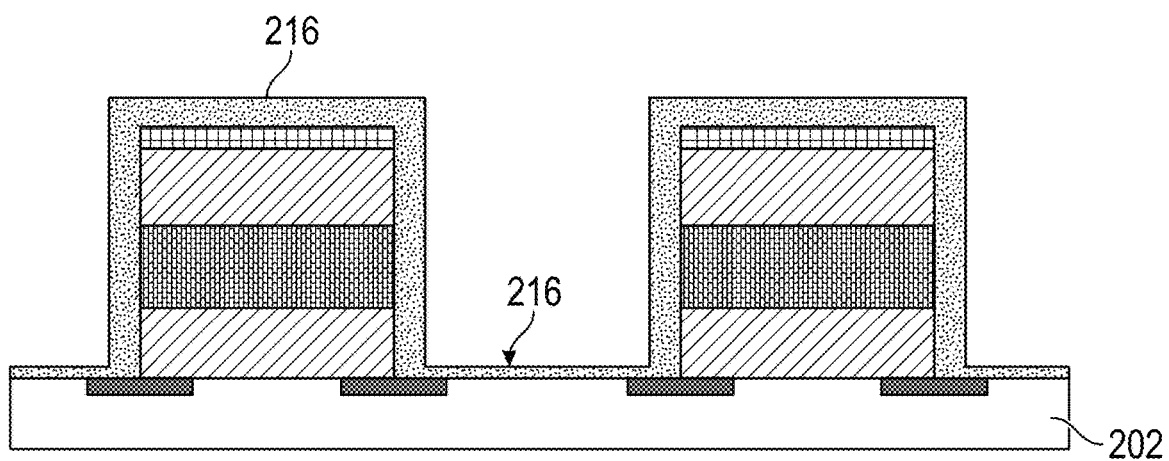
FIG. 2B shows etched openings and formation of a high-K layer, according to aspects of the present disclosure.

In FIG. 2B, processes similar to those described above with respect to FIGS. 1B, 1C and 1D. The substrate is masked and etched to define openings in the layer stack and a high-K layer 216 is formed over the layer stack.

Figure 2C:
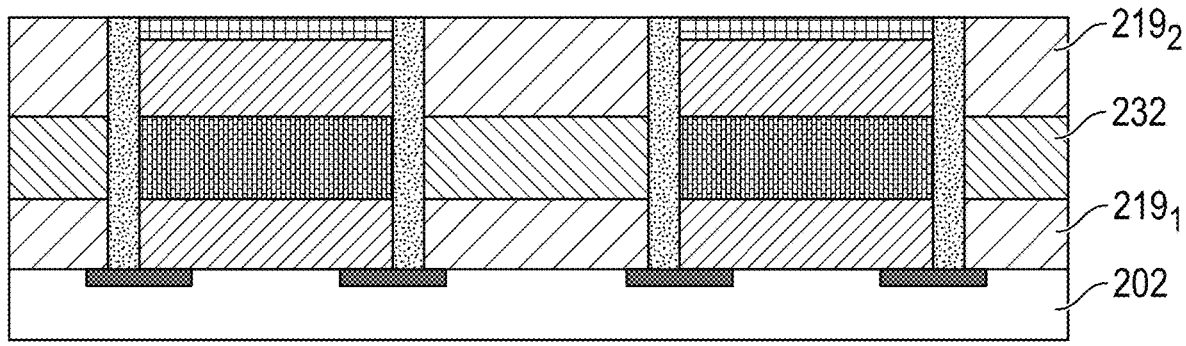
FIG. 2C shows a P+ epi stack grown in the openings of the layer stack, according to aspects of the present disclosure.

In FIG. 2C, the high-K is planarized by an etch back process or by CMP to expose the capping layer and a spacer etch is executed to remove the high-K layer 216 from the substrate floor. A first P+ epi layer, $219_1$ is epitaxially grown within the openings. An undoped silicon layer 232 is deposited upon P+ epi layer $219_1$. A second P+ epi layer, $219_2$ is then epitaxially grown on undoped silicon layer 232.

Figure 2D:
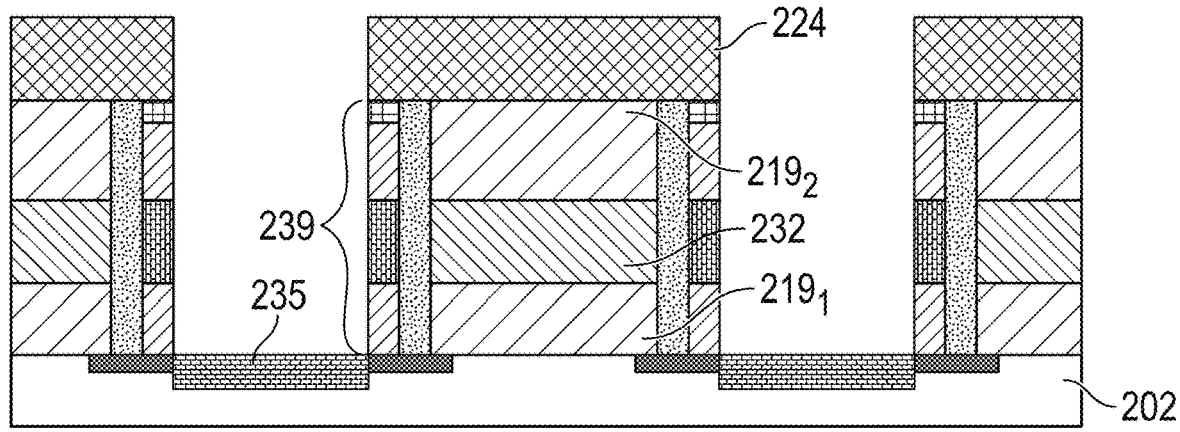
FIG. 2D illustrates patterning and etching of the layer stack with P+ doping of the substrate floor and the etching of sidewall structures for gate electrodes, according to aspects of the present disclosure.

In FIG. 2D, a mask 234 is patterned over the P+ epi layer $219_2$ and an etch is executed to define metal gate electrode regions self-aligned with the dielectric stack. Thus, the epitaxial material can be patterned with a mask 224 that extends beyond a diameter of the epi material to leave a sidewall structure 239 on the epi material. The sidewall structure 239 includes the dielectric-metal 2-dielectric stack. A P+ implant 235 step is then executed to form source/drain connections between the stacks.

Figure 2E:
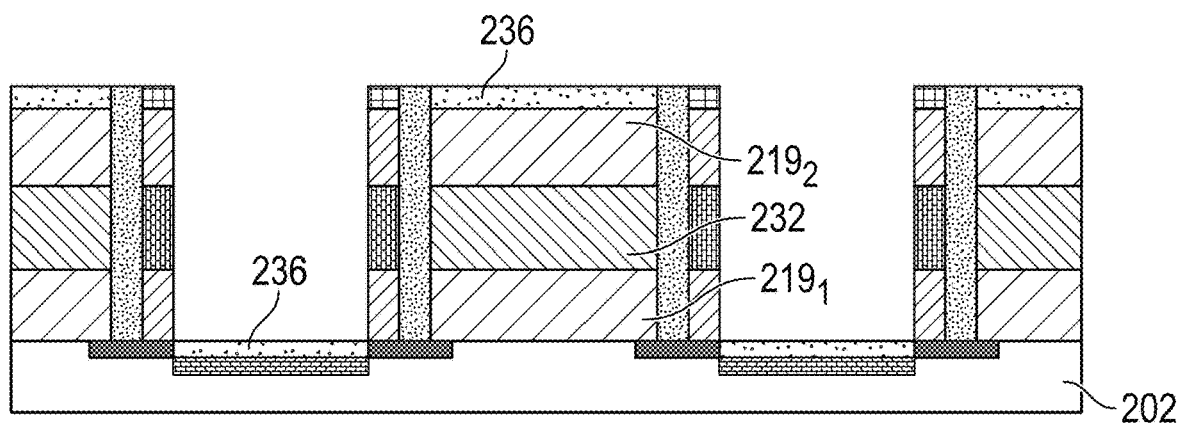
FIG. 2E shows salicidation of the substrate floor and the tops of the P+ epi stacks, according to aspects of the present disclosure.

In FIG. 2E, mask 224 is removed, and a layer of salicide 236 is formed over the P+ implant 235 and over the P+ epi layer $219_2$ by deposition of silicide followed by a spike anneal. An etch is then performed to remove unreacted silicide.

Figure 2F:
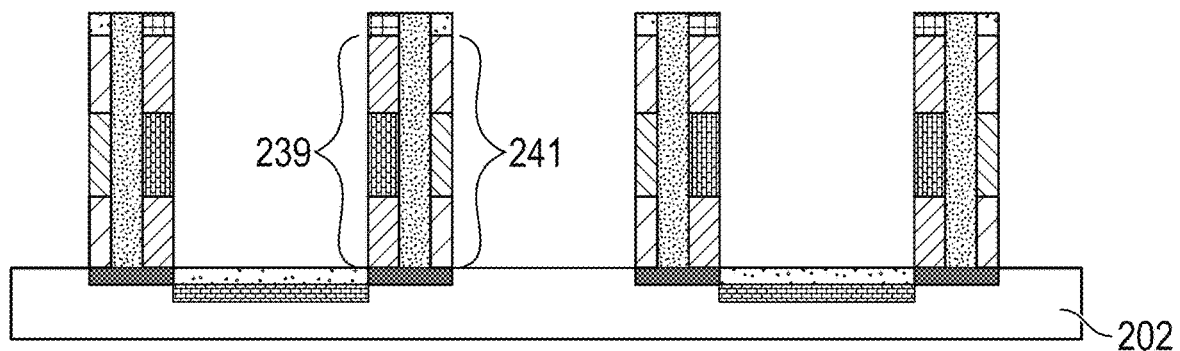
FIG. 2F shows etching of the P+ epi stacks, according to aspects of the present disclosure.

In FIG. 2F, an etch mask is formed to etch a portion of the salicide layer 236 formed over the P+ epi layer 219$_2$ down to the substrate 202 which leaves adjoining structures of the P+ epi stack 241 and the dielectric-metal 2-dielectric stack sidewall structure 239. The etch mask is then removed.

Figure 2G:
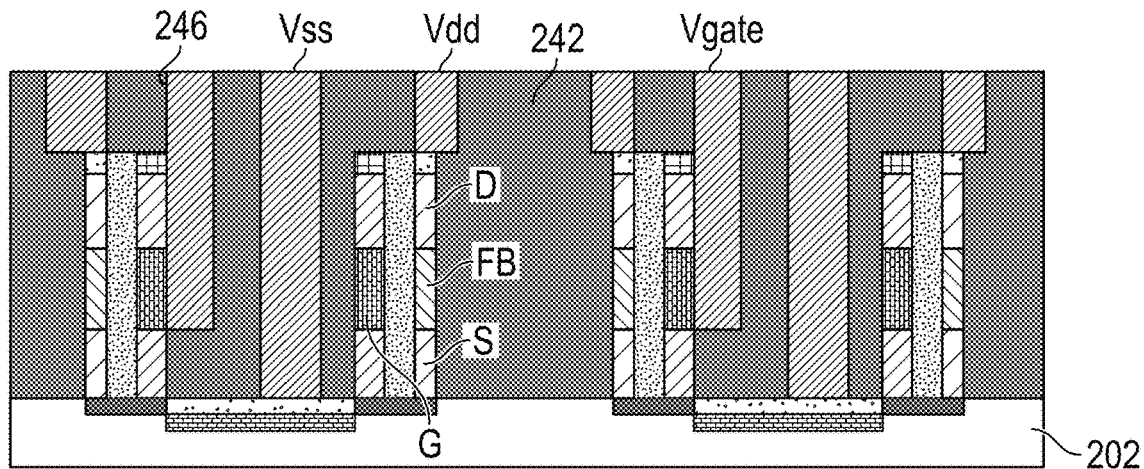
FIG. 2G illustrates the PMOS device coated with a dielectric film and with metallization completed, according to aspects of the present disclosure.

In FIG. 2G, as previously described above with respect to FIG. 1K, a dielectric film 242 is patterned over the substrate and then planarized by etch back or chemical-mechanical polishing (CMP). An etch mask is formed over the dielectric film as previously described with respect to FIG. 1K. Openings are etched, which are filled with via metal 246, and the etch mask is removed. The via metal 246 can be deposited with overburden, with the overburden removed by CMP. Source, S, drain, D, gate G, and floating body FB are labeled. Vss represents the contact through via metal to the source, S. Vdd represents the contact through via metal to the drain, D. Vgate represents the contact through via metal to the Metal 2 layer of the dielectric-metal-dielectric stack sidewall structure 239.

Figure 2H:
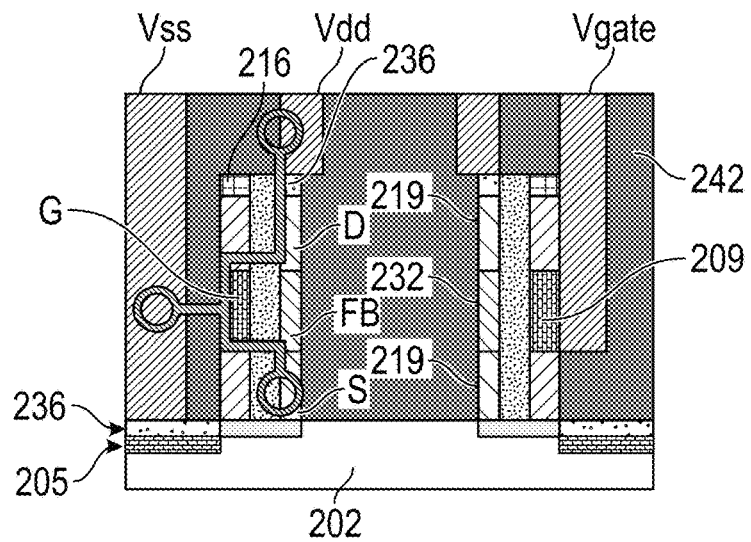
FIG. 2H shows (a) a side view of a single PMOS device and (b) shows a top view of the single PMOS device, according to aspects of the present disclosure.
Figure 2H:
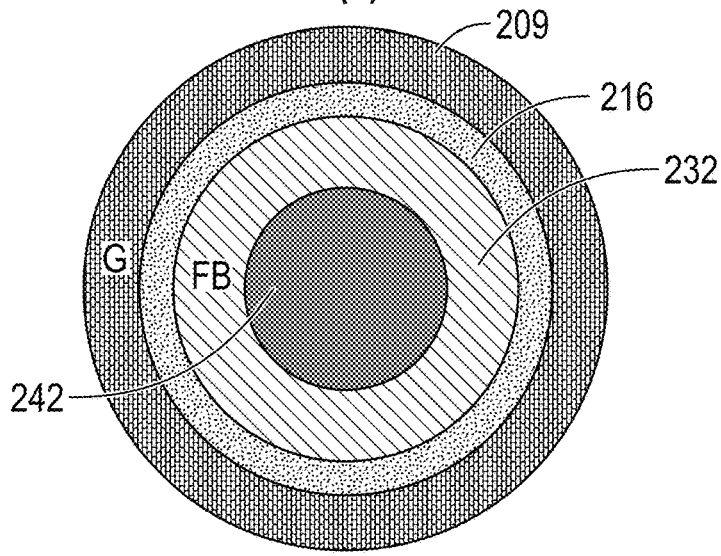

FIG. 2H shows (a) a cross-sectional side view of a single PMOS device separated from the multiple devices shown in FIG. 2G, and (b) is a top view cross-section of the PMOS device taken by a plane through the metal 2 layer 209, floating body silicon layer 232 and dielectric region 242. FIG. 2H(a) shows salicide layer 236 connected to the source region, S. Underlying the salicide layer is the P-type implant 205. Salicide 236 also forms a Vdd contact between the drain (top P+ epi layer 219$_2$) to the Vdd via metal. FIG. 2H(b) shows the dielectric core 242, undoped silicon 232 forming a floating body (FB) surrounding the dielectric core 242, the high-K layer 216 surrounding the undoped silicon 232 and the Metal 2 layer 209 forming the gate, G, surrounding the high-K layer 216.

Figure 2I:
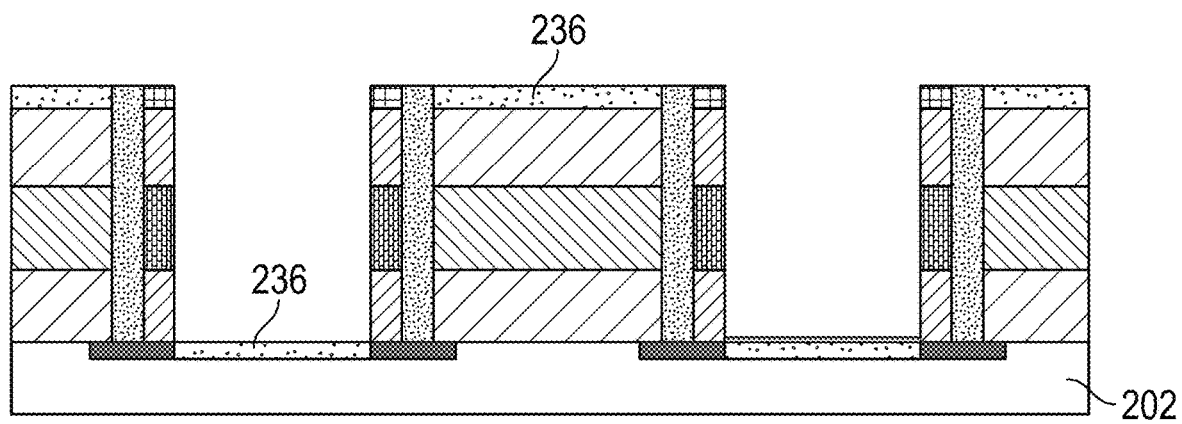
FIG. 2I shows an alternative flow to FIG. 1D in which salicide is formed in the floor of the substrate instead of P+ doping, according to aspects of the present disclosure.
Figure 2J:
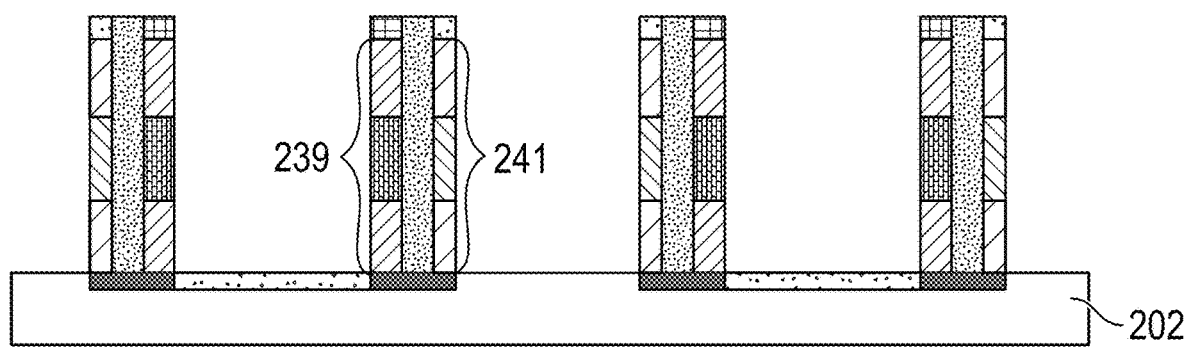
FIG. 2J shows adjoining structures formed from the P+ epi stack 241 and the dielectric-metal 2-dielectric stack, according to aspects of the present disclosure.
Figure 2K:
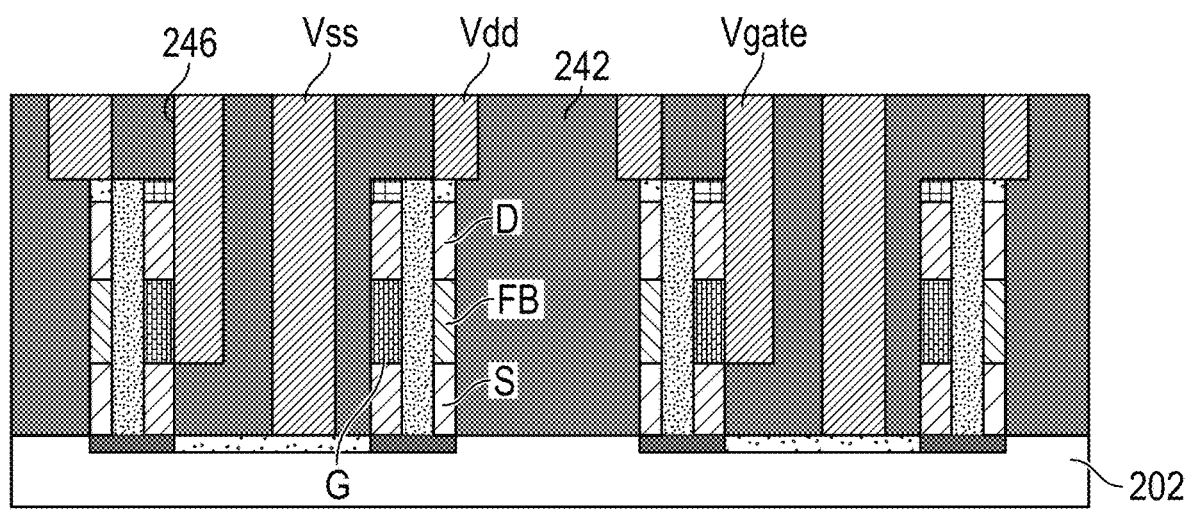
FIG. 2K shows the finished PMOS device of the alternative flow, according to aspects of the present disclosure.

FIGS. 2I-2K illustrate an optional flow without the P+ implant 235 of FIG. 2D. The optional flow duplicates the process steps previously described above and shown with respect to FIG. 2E-2G.

FIG. 2I shows salicide layer 236 formed between the stacks, directly over the substrate 202 and over the P+ epi layer 219$_2$ by deposition of silicide followed by a spike anneal. An etch is then performed to remove unreacted silicide. The salicide layer 236 connects the source regions of two PMOS transistors to the future via metal Vss contact and the drain region of the top P+ epi layer 219$_2$ to the future Vdd metal contact.

As illustrated in FIG. 2J, the substrate of FIG. 2I is processed as previously described and shown in FIG. 2F. An etch mask is formed to etch a portion of the salicide layer 236 and the P+ epi layers, 219$_1$, 232 and 219$_2$, which leaves adjoining structures of the P+ epi stack 241 and the dielectric-metal 2-dielectric sidewall structure 239. The etch mask is then removed.

In FIG. 2K, as described above and previously shown with respect to FIG. 2G, a dielectric film 242 is patterned over the substrate and then planarized by etch back or chemical-mechanical polishing (CMP). An etch mask is formed over the dielectric film and openings are etched, which are filled with via metal 246, and the etch mask is removed. The via metal 246 can be deposited with overburden, with the overburden removed by CMP. Source, S, drain, D, gate G, and floating body FB are labeled. Vss represents the contact through via metal to the source, S. Vdd represents the contact through via metal to the drain, D. Vgate represents the contact through via metal to the Metal 2 layer of the dielectric-metal-dielectric sidewall structure 239. Accordingly, cylindrical (or rectangular), vertical channel devices are formed with a dielectric core and having an undoped silicon (or optionally, germanium, Ge) channel.

Vgate may be a gate metal stack having an interfacial oxide layer, a hafnium oxide layer, HfO, and a titanium nitride layer, TiN. In a non-limiting example, after TiN deposition, a titanium oxy nitride liner is deposited, followed by a titanium carbide layer, TiC. In a non-limiting example, after TiC deposition, a TiN liner is formed followed by a tungsten, W, layer.

Figure 2L:
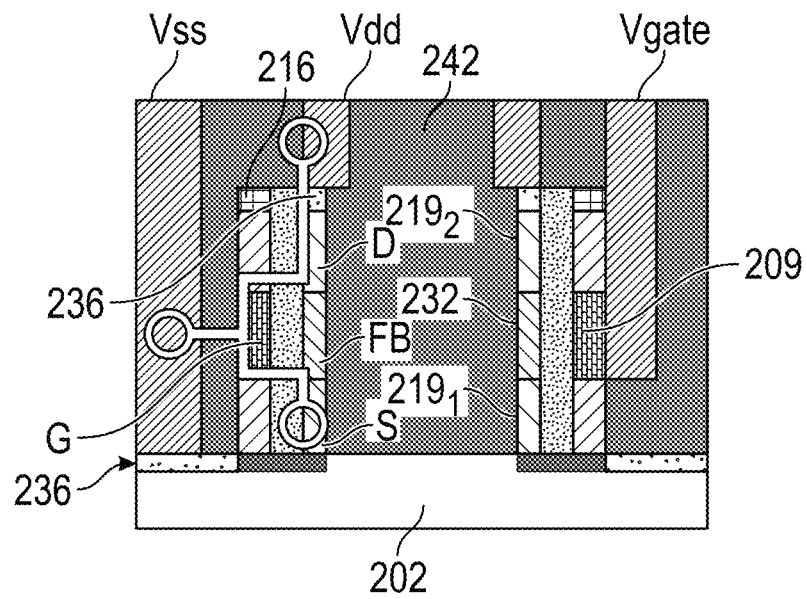
FIG. 2L shows (a) a side view of a single PMOS device and (b) shows a top view of the single PMOS device of the alternative flow, according to aspects of the present disclosure.
Figure 2L:
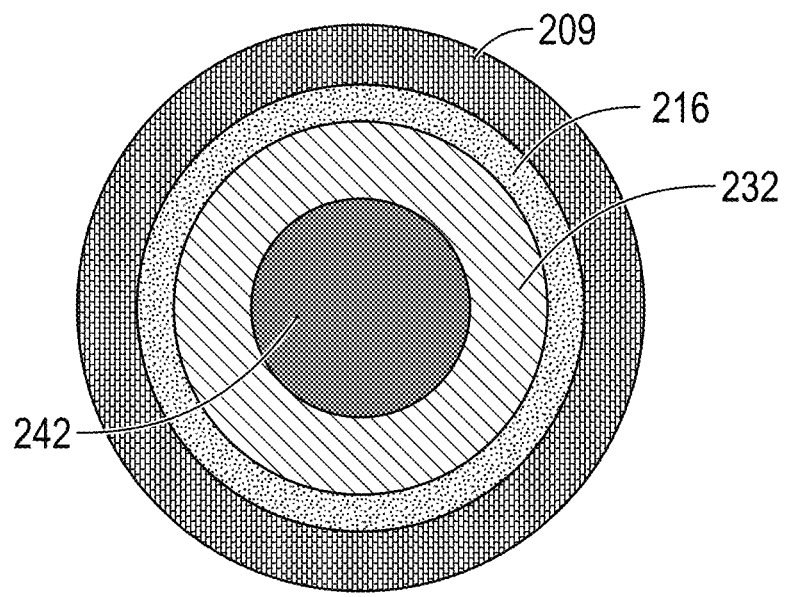

FIG. 2L shows (a) a cross-sectional side view of a single PMOS device separated from the multiple devices shown in FIG. 2K, and (b) is a top view cross-section of the PMOS device taken by a plane through the metal 2 layer 209, floating body silicon layer 232 and a core formed by the dielectric film 242. FIG. 2L(a) shows salicide layer 236 connected to the source region, S. In this optional flow, there is no P-type implant underlying the salicide. Salicide layer 236 also forms a Vdd contact between the drain (top P+ epi layer 219$_2$) to the Vdd via metal. FIG. 2L(b) shows the core formed by the dielectric film 242, undoped silicon 232 forming a floating body (FB) surrounding a core formed by the dielectric film 242, the high-K layer 216 surrounding the undoped silicon 232 and the Metal 2 layer 209 forming the gate, G, surrounding the high-K layer 216. In FIG. 2L(b) a cylindrical cross-section is shown, however, any shape can be envisioned, for example, a rectangular 3D box.

As seen in FIG. 2L, (a) and (b) illustrate a PMOS device extending perpendicular to a substrate 202, having a P+ epitaxially grown stack including a layer of intrinsic semiconductor material 232 between layers of P+ epitaxially grown material (219$_1$, 219$_2$), the P+ epitaxially grown stack wrapping around a dielectric core of dielectric material 142, a layer of high-K material 216 wrapping around the P+ epitaxially grown stack and a gate electrode stack including a Metal 2 layer 209 between layers of dielectric material.

FIGS. 3A-3P, Flow C, illustrate the formation of a high-performance FB VFET with dielectric core CMOS.

The process flow of FIGS. 3A-3P is similar to the previous process flow, but stepwise masking and uncovering is used for different doping and materials. Additionally, a dielectric isolation break is formed to electrically isolate the PMOS and NMOS devices.

In FIG. 3A, a P-type silicon substrate 300 is patterned with photomask 320 to cover a portion of the P-type region of the substrate. An N-type implant process is executed to form an N-type background doped region 303.

In FIGS. 3B and 3C, photomask 320 is removed. A dielectric layer 337 is deposited on the P-type substrate 404. The dielectric layer can include oxide based (e.g. SiOx, SiOxNy based) dielectric materials. A capping layer 312 is deposited on the dielectric layer. A photomask 322 is patterned on the capping layer 312 to leave an opening 345 between the N-type and P-type regions. A dielectric is diffused into this opening to form a dielectric diffusion break 346. After forming the dielectric diffusion break 346, the substrate is planarized to remove the photomask 322, the capping layer 312 and the dielectric layer 337 by etch back or CMP, followed by an anneal to complete the dielectric diffusion break between future NMOS and PMOS regions.

In FIGS. 3C and 3D, stepwise masking and implantation for N+ and P+ regions is executed. In FIG. 3C, the substrate is patterned with photomask 324 which covers the dielectric diffusion break 346 and the P-type substrate 300. A P+ implant 305 is executed to dope regions of the N-type background doped region 303. The photomask 324 is then removed. In FIG. 3D, the substrate is patterned with photomask 326 which covers N-type background doped region 303 and the dielectric diffusion break of the substrate 300. An N+ implant 304 is executed to dope regions of the P-type substrate 300.

Next, in FIG. 3E, the doping mask 326 is removed, then a layer stack is deposited on the substrate. This layer stack includes a first dielectric layer 306, then a Metal 1 layer 308, then a second dielectric layer 310. A capping layer 312 is formed on top of the second dielectric layer 310. The Metal 1 region will become a future gate electrode of the CMOS devices.

In FIG. 3F, the substrate is masked with a photomask as previously described and illustrated with respect to FIGS. 1D and 2B, and then etched to create openings for future P+ epi regions. The photomask is removed, and a high-K layer 316 is deposited on all surfaces.

As shown in FIG. 3G, a spacer etch is executed to remove the high-K layer 316 from the substrate floor. The high-K layer 316 on the tops of the layer stacks is planarized by an etch back process or by CMP to expose the capping layer. A dielectric film 342 is deposited over the entire substrate.

As shown in FIG. 3H, the dielectric film 342 is patterned with an etch mask 328 to cover the N+ implant 304 regions of the substrate and define openings 352 down to the P+ implant 305 regions for future P+ epi regions.

As shown in FIG. 3I, a P+ epi stack is grown with an intermediate or middle layer of intrinsic (undoped) silicon 332. The intrinsic silicon 332 is between a first P+ epi layer $319_1$ and a second P+ epi layer $319_2$. The etch mask 328 is removed.

As shown in FIG. 3J, the process is repeated for each of the N+ implant 304 regions by masking the P+ epi region and dielectric diffusion break and etching openings to implant N+ epi stacks over the N+ implants 304 of the P-type substrate 300 resulting in a layer of intrinsic silicon in between N+ epi layers. The intrinsic silicon 332 is between a first N+ epi layer $318_1$ and a second N+ epi layer $318_2$. The etch mask (not shown) is removed.

As shown in FIG. 3K, the N+ and P+ epi stacks and dielectric cores are masked with etch mask 330, as well as part of the dielectric-metal stack, then etched to form sidewall structures around the P+ and N+ epi stacks. Etch mask 330 is then removed. Note that the gate electrodes are Metal 1 308.

As shown in FIG. 3L, as previously shown and described with respect to FIG. 1F and FIG. 2D, the substrate is stepwise masked for optionally implanting P+ dopants 335 in the source/drain regions between the sidewall structures of the P+ epi stack and for optionally implanting N+ dopants 334 in the source/drain regions between the sidewall structures of the N+ epi stack. The substrate is then masked with etch mask 331 to protect the PMOS regions and the N+ epi regions, and the Metal 1 308 is removed from the NMOS regions and replaced with Metal 2 309. The etch mask 331 is removed.

In FIG. 3M, salicide layers 336 are completed as previously shown and described with respect to FIGS. 1G and 2E. A dielectric film 342 is patterned over the substrate and then planarized by etch back or chemical-mechanical polishing (CMP). The dielectric film 342 should be etch selective to the second dielectric 310.

In FIG. 3N, an etch mask (not shown) is formed over the dielectric film 342 and openings are etched for future via metal as previously shown and described with respect to FIGS. 1K and 2K and the etch mask is removed.

In FIG. 3O, via metal can be deposited with overburden, with the overburden removed by CMP. Vg, Vss and Vdd are marked for each of the PMOS and NMOS transistors. For the PMOS transistor, the source contact, Vss, connects to the P+ implant 335 and P+ epi layer $319_1$ through the via metal and salicide layer 336, Vg connects to the Metal 2 gate electrode, and Vdd connects through via metal and salicide layer 336 to P epi layer $319_2$. For the NMOS transistor, the source contact, Vss, connects to the N+ implant 334 and N+ epi layer $318_1$ through the via metal and the salicide layer, Vg connects to the Metal 1 gate electrode, and Vdd connects through via metal and salicide layer 336 to N+ epi layer $318_2$. The PMOS and NMOS transistors are electrically isolated from each other by the dielectric film 342 and the dielectric diffusion break 346.

Accordingly, cylindrical (or rectangular), vertical channel devices are formed with a dielectric core and having an undoped silicon (or optionally, germanium, Ge) channel.

FIG. 3P shows (a) a cross-sectional side view of the PMOS and NMOS devices on the same substrate, where line B represents a plane through the gate of the PMOS device and line C represents a plane through the gate of the NMOS device, (b) is a top view cross-section of the PMOS device taken by plane B through the metal 2 gate electrode (G), floating body (FB) silicon layer and dielectric core, and (c) is a top view cross-section of the NMOS device taken by plane C through the metal 1 gate electrode G, floating body (FB) silicon layer and dielectric core.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A device, comprising:
a first stack of epitaxially grown semiconductor material extending perpendicular to a working surface of a substrate, the first stack of epitaxially grown semiconductor material wrapping around a first dielectric material structure extending perpendicular to the working surface of a substrate, the first stack of epitaxially grown semiconductor material including a layer of intrinsic semiconductor material in between layers of doped semiconductor material, a bottom layer of the first stack of epitaxially grown semiconductor material forming a first source/drain, the layer of intrinsic semiconductor material being a channel of a first field effect transistor, and the upper layer of the first stack of epitaxially grown semiconductor material forming a second source/drain; and
a second stack extending perpendicular to the working surface and positioned in a plane with the first stack of epitaxially grown semiconductor material, the second stack wrapping around the first stack of epitaxially grown semiconductor material, the second stack having a first metal layer positioned in between layers of dielectric material, the first metal layer forming a gate of the first field effect transistor.

2. The device of claim 1, wherein the layer of intrinsic semiconductor material is at a same plane as the first metal layer.

3. The device of claim 1, wherein a high-K dielectric is formed between the first stack and the second stack.

4. The device of claim 1, further comprising:
a doped implant region located along the working surface of the substrate beneath the first stack of epitaxially grown semiconductor material and the second stack.

5. The device of claim 1, further comprising:
a first salicide layer located along the working surface of the substrate beneath the first dielectric material structure; and
a second salicide layer located on a top layer of the first stack.

6. The device of claim 5, further comprising:
a first doped implant layer located along the working surface of the substrate beneath the first stack of epitaxially grown semiconductor material and the second stack; and
a second doped implant layer located along the working surface of the substrate beneath the first salicide layer.

7. The device of claim 1, wherein:
the first field effect transistor is an NMOS device;
the first stack of epitaxially grown semiconductor material includes an N+ epitaxially grown semiconductor material;
the first metal layer of the second stack is a Metal 1 material; and
the first stack of epitaxially grown semiconductor material and the second stack are located over an N+ implant region of the substrate.

8. The device of claim 1, wherein:
the first field effect transistor is a PMOS device;
the first stack of epitaxially grown semiconductor material includes a P+ epitaxially grown semiconductor material;
the first metal layer of the second stack is a Metal 2 material; and
the first stack of epitaxially grown semiconductor material and the second stack are each located over a P+ implant region of the substrate.

9. The device of claim 8, further comprising:
wherein the substrate is configured as a P-type substrate including a background doped N-type region and the PMOS device extends perpendicular to the background doped N-type region;
a second field effect transistor which is an NMOS device, the NMOS device including:
a third stack of epitaxially grown N+ semiconductor material extending perpendicular to the working surface of the P-type substrate, the third stack of epitaxially grown semiconductor material wrapping around a second dielectric material structure, the third stack of epitaxially grown N+ semiconductor material including the layer of intrinsic semiconductor material in between layers of N+ doped semiconductor material, a bottom layer of the third stack of epitaxially grown semiconductor material forming a third source/drain, the layer of intrinsic semiconductor material being a channel of the second field effect transistor, and the upper layer of the third stack of epitaxially grown semiconductor material forming a fourth source/drain;
a fourth stack extending perpendicular to the working surface of the P-type substrate, positioned in plane with the third stack of epitaxially grown semiconductor material and wrapping around the third stack, the fourth stack having a second metal layer of Metal 1 material positioned in between layers of dielectric material, the second metal layer forming a gate of the second field effect transistor;
the third stack of epitaxially grown semiconductor material and the fourth stack located over the P-type substrate, the P-type substrate including P+ implant regions; and
a dielectric diffusion break located along the working surface of the substrate between the background doped N-type region and the P-type substrate, wherein the dielectric diffusion break is configured to electrically isolate the PMOS device from the NMOS device.

10. The device of claim 1, further comprising:
a first metal via connecting from a Vg contact to the first metal layer;
a second metal via connecting from a Vss contact to the first source/drain; and
a third metal via connecting from a Vdd contact to the second source/drain, wherein the first metal via, the second metal via and the third metal via are located in a dielectric film.

11. A semiconductor device, comprising:
a P-type substrate including a PMOS field effect transistor adjacent an NMOS field effect transistor, the P-type substrate including:
a dielectric diffusion break configured to electrically isolate the PMOS field effect transistor from the NMOS field effect transistor;
a background doped N-type region;
the PMOS field effect transistor including:
a first stack of epitaxially grown semiconductor material located over a P-type implant region of the P-type substrate and extending perpendicular to a working surface of a substrate, the first stack wrapping around a first dielectric material structure, the first stack of epitaxially grown semiconductor material including a first layer of intrinsic semiconductor material in between layers of P+ doped semiconductor material, a bottom layer of the first stack forming a first source/drain, the first layer of intrinsic semiconductor material being a channel of the PMOS field effect transistor, and the upper layer of the first stack forming a second source/drain;

a second stack extending perpendicular to the working surface positioned in plane with the first stack and wrapping around the first stack, the second stack having a first metal layer formed of Metal 2 material, the first metal layer positioned in between layers of dielectric material, the first metal layer forming a gate of PMOS field effect transistor;

wherein the first layer of intrinsic semiconductor material is at a same plane as the first metal layer;

the NMOS field effect transistor including:

a third stack of epitaxially grown semiconductor material extending perpendicular to a working surface of the P-type substrate, the third stack wrapping around a second dielectric material structure, the third stack of epitaxially grown semiconductor material including a second layer of intrinsic semiconductor material in between layers of N+ doped semiconductor material, a bottom layer of the third stack forming a third source/drain, the second layer of intrinsic semiconductor material being a channel of the NMOS field effect transistor, and the upper layer of the third stack forming a fourth source/drain;

a fourth stack extending perpendicular to the working surface of the P-type substrate, positioned in plane with the third stack and wrapping around the third stack, the fourth stack having a second metal layer of Metal 1 material positioned in between layers of dielectric material, the second metal layer forming a gate of the second field effect transistor;

wherein the second layer of intrinsic semiconductor material is at a same plane as the second metal layer;

a first high-K layer formed between the first stack and the second stack; and a second high-K layer formed between the third stack and the fourth stack.

12. The semiconductor device of claim 11, further comprising:

a first P+ doped implant region located within the background doped N-type region and positioned beneath the first stack and the second stack; and a first N+ doped implant region located within the P-type substrate beneath the third stack and the fourth stack.

13. The semiconductor device of claim 12, further comprising:

a second P+ doped implant region located within the background doped N-type region beneath the first dielectric material structure; and a second N+ doped implant region located within the P-type substrate beneath the second dielectric material structure.

14. The semiconductor device of claim 12, further comprising:

a first salicide layer located along the working surface of the substrate beneath the first dielectric material structure;

a second salicide layer located on a top layer of the first stack;

a third salicide layer located along the working surface of the substrate beneath the second dielectric material structure; and a fourth salicide layer located on a top layer of the third stack.

15. The semiconductor device of claim 14, further comprising:

a second P+ doped implant region located beneath the first salicide layer and the first dielectric material structure; and a second N+ doped implant region located beneath the third salicide layer and the second dielectric material structure.

16. The semiconductor device of claim 11, further comprising:

a first metal via connecting from a first Vg contact to the first metal layer;

a second metal via connecting from a first Vss contact to the first source/drain; and a third metal via connecting from a first Vdd contact to the second source/drain, wherein the first metal via, the second metal via and the third metal via are located in the first dielectric material structure;

a fourth metal via connecting from a second Vg contact to the second metal layer;

a fifth metal via connecting from a second Vss contact to the third source/drain; and a sixth metal via connecting from a second Vdd contact to the fourth source/drain, wherein the fourth metal via, the fifth metal via and the sixth metal via are located in the second dielectric material structure.

17. A method of microfabrication of a semiconductor device, the method comprising:

epitaxially growing a first stack of semiconductor material extending perpendicular to a working surface of a substrate, the first stack wrapping around a first dielectric material structure, the first stack including a first layer of intrinsic semiconductor material in between layers of doped semiconductor material, a bottom layer of the first stack forming a first source/drain, the first layer of intrinsic semiconductor material being a channel of a first field effect transistor, and an upper layer of the first stack forming a second source/drain;

depositing a second stack extending perpendicular to the working surface positioned in plane with the first stack and wrapping around the first stack, the second stack having a first metal layer positioned in between layers of dielectric material and at a same plane as the first layer of intrinsic semiconductor material, the first metal layer forming a gate of the first field effect transistor;

forming a high-K layer between the first stack and the second stack; and implanting a doped region located along the working surface of the substrate beneath the first stack and the second stack.

18. The method of microfabrication of a semiconductor device of claim 17, further comprising:

forming the first field effect transistor as a PMOS field effect transistor by epitaxially growing the first stack from P+ semiconductor material over the doped region, wherein the doped region is a first P+ implant region;

forming the first metal layer from Metal 2 material;

forming a high-K dielectric between the first stack and the second stack;

forming the first source/drain by forming at least one of a second P+ implant region and a salicide layer on the substrate in an opening in the second stack;

depositing a dielectric film over the substrate;

forming a first metal via connecting from a Vg contact to the first metal layer;

forming a second metal via connecting from a Vss contact to the first source/drain; and forming a third metal via connecting from a Vdd contact to the second source/drain, wherein the first metal via, the second metal via and the third metal via are located in the dielectric film.

19. The method of microfabrication of a semiconductor device of claim 17, further comprising:

forming the first field effect transistor as an NMOS field effect transistor by implanting the doped region of the substrate with an N+ type implant region;

epitaxially growing the first stack from N+ semiconductor material over the doped region, wherein the doped region is a first N+ implant region;

forming the first metal layer from Metal 1 material;

forming a high-K dielectric between the first stack and the second stack;

forming the first source/drain by forming at least one of a second N+ implant region and a salicide layer on the substrate in an opening in the second stack;

forming a first metal via connecting from a Vg contact to the first metal layer;

forming a second metal via connecting from a Vss contact to the first source/drain; and forming a third metal via connecting from a Vdd contact to the second source/drain, wherein the first metal via, the second metal via and the third metal via are located in a dielectric film.

20. The method of microfabrication of a semiconductor device of claim 17, further comprising:

implanting a portion of the substrate with an N-type implant, wherein the substrate is a P-type substrate;

forming the first field effect transistor as a PMOS field effect transistor by implanting a P+ type implant region in the portion of the substrate having an N-type implant;

epitaxially growing the first stack from P+ semiconductor material over the P+ type implant region;

forming the first metal layer from Metal 2 material;

forming a high-K dielectric between the first stack and the second stack;

forming the first source/drain by forming at least one of a second P+ implant region and a salicide layer on the substrate in an opening in the second stack;

forming a second field effect transistor adjacent the first field effect transistor, the second field effect transistor being an NMOS field effect transistor, by epitaxially growing a third stack of epitaxially grown semiconductor material extending perpendicular to a working surface of the P-type substrate, the third stack of epitaxially grown semiconductor material wrapping around a second dielectric material structure, the third stack of epitaxially grown semiconductor material including a second layer of intrinsic semiconductor material in between layers of N+ doped semiconductor material, a bottom layer of the third stack forming a third source/drain, the second layer of intrinsic semiconductor material being a channel of the second field effect transistor, and the upper layer of the third stack forming a fourth source/drain;

forming a fourth stack extending perpendicular to the working surface of the P-type substrate, positioned in plane with the third stack and wrapping around the third stack, the fourth stack having a second metal layer of Metal 1 material positioned in between layers of dielectric material, the second metal layer forming a gate of the second field effect transistor;

wherein the second layer of intrinsic semiconductor material is at a same plane as the second metal layer;

forming a second high-K layer formed between the third stack and the fourth stack;

forming the third source/drain by forming at least one of a second N+ implant region and a salicide layer on the substrate in an opening in the second stack;

forming a dielectric diffusion break in the substrate between the PMOS field effect transistor and the NMOS field effect transistor;

depositing a depositing a dielectric film over the substrate;

forming a first metal via connecting from a first Vg contact to the first metal layer;

forming a second metal via connecting from a first Vss contact to the first source/drain;

forming a third metal via connecting from a first Vdd contact to the second source/drain;

forming a fourth metal via connecting from a second Vg contact to the second metal layer;

forming a fifth metal via connecting from a second Vss contact to the third source/drain; and forming a sixth metal via connecting from a second Vdd contact to the fourth source/drain, wherein the first metal via, the second metal via, the third metal via, the fourth metal via, the fifth metal via and the sixth metal via are located in the dielectric film.

* * * * *